United States Patent [19]

Tabuchi

[11] Patent Number: 5,388,106
[45] Date of Patent: Feb. 7, 1995

[54] TUNABLE OPTICAL SOURCE FOR PRODUCING A COHERENT OPTICAL BEAM WITH A WIDE RANGE OF WAVELENGTH TUNING

[75] Inventor: Haruhiko Tabuchi, Kawasaki, Japan

[73] Assignee: Fujitsu Limited, Kawasaki, Japan

[21] Appl. No.: 232,398

[22] Filed: Apr. 25, 1994

Related U.S. Application Data

[63] Continuation of Ser. No. 93,898, Jul. 20, 1993, abandoned, which is a continuation of Ser. No. 888,761, May 27, 1992, abandoned.

[30] Foreign Application Priority Data

May 27, 1991 [JP] Japan ................. 3-121306

[51] Int. Cl.[6] ............................................. H01S 3/10
[52] U.S. Cl. ........................................ 372/20; 372/26; 372/46; 372/50
[58] Field of Search ................... 372/20, 50, 46, 26

[56] References Cited

U.S. PATENT DOCUMENTS 4,111,521  9/1978  Streifer et al. .............. 350/96.13
5,200,969  4/1993  Paoli ............................. 372/20

OTHER PUBLICATIONS

Scifres et al., "Semiconductor lasers with integrated interferometric reflectors," *Applied Physics Letters*, vol. 30, No. 11, Jun. 1, 1977, pp. 585–587.

Fukui et al., "Suppression of Mode Hopping Noise Caused by External Reflection in Dynamic Single Mode (DSM) Lasers," *The Transactions of the IEICE*, vol. E370, No. 9, Sep. 1987, pp. 857–864.

Kotaki et al., "Tunable DBR Laser with Wide Tuning Range," *Electronics Letters*, vol. 24, No. 8, Apr. 14, 1988, pp. 503–505.

*Patent Abstract of Japan*, vol. 13, No. 26 (E-706) Jan. 20, 1989 & JP-A-229796 (Fujitsu) Sep. 26, 1988.
*Patent Abstracts of Japan*, vol. 14, No. 248 (E-933) May 28, 1990 & JP-A-2 069983 (Toshiba) Mar. 8, 1990.
M. Schilling et al., "Widely Tunable Y-Coupled Cavity Integrated Interferometric Injection Laser," *Electronics Letters*, vol. 26, No. 4, 15th Feb. 1990, pp. 243–244.

*Primary Examiner*—James W. Davie
*Attorney, Agent, or Firm*—Staas & Halsey

[57] ABSTRACT

A tunable laser diode comprises a first reflector, a second reflector, an optical cavity extending between the first reflector and the second reflector for establishing an optical resonance by transmitting an optical beam therethrough, and a gain region for amplifying the optical beam. The optical cavity comprises a first waveguide part connected to the first reflector and extending toward the second reflector, a second waveguide part connected to the second reflector and extending toward the first reflector, a third waveguide part connecting the first waveguide part and the second waveguide part with each other for passing a first optical beam between the first and second reflectors, and a fourth waveguide part connecting the first waveguide part and the second waveguide part for passing a second optical beam between the first and second reflectors, wherein the first waveguide part, the second waveguide part and the third waveguide part form a first optical path having a first optical path length while the first waveguide part, the second waveguide part and the fourth waveguide part form a second optical path having a second optical path length that is different from said first optical path length. In correspondence to the third and fourth waveguide parts, a refractive index modulator is provided for changing a refractive index of the third waveguide part and the fourth waveguide part relatively with each other.

28 Claims, 14 Drawing Sheets

30

TUNABLE OPTICAL SOURCE FOR PRODUCING A COHERENT OPTICAL BEAM WITH A WIDE RANGE OF WAVELENGTH TUNING

This application is a continuation of application Ser. No. 08/093,898, filed Jul. 20, 1993, now abandoned which is, in turn, a continuation of application Ser. No. 07/788,761, filed May 27, 1992, now abandoned.

BACKGROUND OF THE INVENTION

The present invention generally relates to semiconductor devices, and more particularly to a tunable laser diode that has a branched optical cavity for realizing a large shift of laser oscillation.

In the optical telecommunication systems that use the wavelength multiplexing technique, a tunable laser diode that can change the wavelength of the output optical beam for a wide wavelength range is indispensable. Such a tunable laser diode is used for example for an optical local oscillator of optical heterodyne detectors. In the optical heterodyne detectors, a non-linear mixing of two optical beams is achieved at a photodetector, wherein one of the optical beams carries information while the other is a local optical beam that is produced by the optical local oscillator. Thereby, the information carried on the optical beam is converted to an intermediate electrical signal having an intermediate frequency. It should be noted that the intermediate electrical signal contains the information content that has been modulated on the optical beam by any of amplitude modulation, frequency modulation or phase modulation. By changing the wavelength of the optical local oscillator in accordance with the wavelength of the incident optical beam, one can obtain the intermediate frequency signal with a substantially constant frequency. It should be noted that such an optical heterodyne detection is particularly suitable for extracting a desired signal from a number of signals that are multiplexed on the optical beam. In order to realize the optical local oscillator, it will be understood that the development of the tunable laser diode that has the capability of extensive wavelength tuning is essential.

Conventionally, a so-called DBR laser diode is proposed for a tunable laser diode (Kotaki et al., Electronics Letters, Vol. 24, No. 8, 1988, 503–505; Broberg et al., Applied Physics Letters, Vol. 52, No. 16, 1988, pp. 1285–1287). In the DBR laser diode, a Bragg reflector consisting of a corrugation is provided in the optical cavity of the laser diode adjacent to, and in alignment with the active layer so that the corrugation causes a Bragg reflection of the optical beam. There, the optical beam is amplified by the stimulated emission in the active layer as it is reflected back and forth by the corrugation. The shift of the wavelength of the optical beam is achieved by injecting carriers into the Bragg reflector. It should be noted that such an injection of the carries induces a change of the refractive index in the material that forms the corrugation by the plasma effect, and such a change of the refractive index in turn causes a change of the effective pitch of the corrugation. Thereby, the wavelength of the optical beam that establishes the Bragg reflection is changed.

Unfortunately, the magnitude of the wavelength change that is achieved by the DBR laser diode of this prior art is relatively limited. For example, Kotaki et al. op. cit. describes a change of the laser oscillation of only 6.2 nm in the 1.53 μm band, while Broberg et al. op. cit. describes a change of 11.6 nm in the 1.55 μm band. The reason of this unsatisfactory result is attributed to the very fundamental principle of the wavelength shifting that the laser diode of this prior art relies upon. For example, in the case of the DBR laser diode reported by Broberg et al. op. cit., the laser oscillation may be interrupted when the injection of the carriers into the corrugation is reduced for changing the refractive index of the Bragg reflector. Since the active layer extends to the region of the Bragg reflector, the reduction of the carrier injection to the Bragg reflector inevitably results in the reduction of the optical gain. The attempt to compensate for such a decreased carrier injection by increasing the carrier injection in the active layer is generally limited because of the problem of excessive heating and hence the reliability of operation of the laser diode. Once the laser oscillation is established, on the other hand, there is a tendency for the carrier density to be clamped at a constant level. This effect also acts to reduce the range of the wavelength tuning. In the DBR laser diode reported by Kotaki et al., op. cit., the tuning range is determined by the maximum injection current to the DBR region, which in turn is limited by the heating effect.

As a tunable laser diode, a DFB laser diode having segmented electrodes has also been proposed (Kotaki et al., Electronic Letters, Vol. 25, No. 15, 1989, pp. 990–992). This prior art laser diode has an active layer extending throughout the optical cavity, and there is provided a corrugation in the optical cavity extending from a first end to a second, opposite end of the laser diode, as is usual in the DFB laser diode. In the corrugation, there is provided a λ/4-shift point where the phase of the corrugation is shifted by a quarter ($\frac{1}{4}$) of the pitch or wavelength of the corrugation. Thereby, there occurs a strong concentration of optical radiation in the optical cavity in correspondence to the λ/4-shift point. This in turn causes a strong depletion of carriers in correspondence to the λ/4-shift point due to the facilitated stimulated emission.

In this prior art DFB laser diode, the electrodes that form the segmented electrodes are provided in alignment with the optical axis with a physical separation from each other, wherein one of the electrodes is provided in correspondence to this λ/4-shift point. By controlling the injection current to the electrode that is located immediately above the λ/4-shift point and further by controlling the injection current to the rest of the electrodes independently, the profile of the carrier distribution and hence the intensity distribution of the optical radiation is modified as desired. For example, by decreasing the carrier injection to the electrodes that are offset from the λ/4-shift point, the non-uniform distribution of the carriers in the optical cavity is enhanced. Thereby, the overall refractive index of the optical cavity is decreased by the plasma effect, which in turn results in a decreased Bragg wavelength. Such a decrease of the Bragg wavelength results in a decrease of the oscillation wavelength of the laser diode.

When increasing the oscillation wavelength, on the other hand, the injection current at the electrode above the λ/4-shift point is increased such that carrier distribution in the optical cavity becomes more uniform. With such a change of the carrier distribution profile, the refractive index of the optical cavity is increased as a whole, which in turn results in an increase of effective cavity length of the laser diode. Thereby, the oscillation wavelength of the laser diode increases.

This prior art device also has a drawback in that the magnitude of the wavelength shift is not sufficient for the optical local oscillator mentioned previously. This problem becomes particularly conspicuous when increasing the oscillation wavelength. As already noted, the increase of the oscillation wavelength is achieved by decreasing the carrier injection to the electrodes located at opposite sides of the λ/4-shift point. However, the magnitude of the decrease of the carrier injection is limited by the constraint that the laser oscillation has to be sustained. Further, the increase of the carrier injection to the λ/4-shift point is limited, as an excessive increase of the carrier injection tends to cause a decrease of the oscillation wavelength by the adversary plasma effect, which acts oppositely to the desired effect. Generally, the DFB laser diode of this type provides a range of wavelength shift that is even smaller than that of the first type device mentioned previously. For example, Kotaki et al. op. cit. reports a wavelength shift of 2.2 nm.

In order to realize a much larger shift of oscillation wavelength, a third type tunable laser diode that uses a split optical cavity has been proposed (Schilling et. al., Electronics Letters, Vol. 26, No. 4, 1990, pp. 243–244; Schilling et al., IEEE J. Quantum Electronics, Vol. 27, No. 6, 1991, 1616–1624; Hildebrand et al., 17th ECOC'91/IOOC'91, 1991, Paper #Tu.A5.1; Idler et. al., Electronics Letters, Vol. 27, No. 24, 1991, pp. 2268–2270). In this type of tunable laser diode, there is provided a Y-shaped, branched optical cavity that divides the optical beam into two beams. The two optical beams thus produced cause an interference in correspondence to the part where the two branches merge with each other. By controlling the refractive index of one or both of the branches so that there occurs a constructive interference between the two optical beams, one can achieve a laser oscillation at a desired oscillation wavelength.

Next, the principle of this type of tunable laser diode will be explained in more detail with reference to FIG. 1, which shows the structure of a conventional tunable laser diode 10.

Referring to FIG. 1 showing the laser diode 10 in a plan view, the device includes two optical cavities $B_1$ and $B_2$ that merge with each other in correspondence to a gain region 10a. In other words, the gain region 10a is common to the optical cavities $B_1$ and $B_2$. In correspondence to the gain region 10a, there is provided an active part of the laser diode that amplifies the optical beam passing therethrough by stimulated emission. Further, in correspondence to the part where the cavities $B_1$ and $B_2$ are branched from each other, regions 10b and 10c are formed respectively for modifying the refractive index thereof. The optical cavities $B_1$ and $B_2$ have respective optical lengths $L_1$ and $L_2$, wherein the optical length $L_1$ of the cavity $B_1$ is set different from the optical length $L_2$ of the cavity $B_2$. In the illustrated example, the optical length $L_2$ is set larger than the optical length $L_1$.

FIGS. 2(A) and 2(B) show the standing waves that are formed in the optical cavities $B_1$ and $B_2$ by the optical beam produced by the gain region 10a. There, it will be noted that the phase of the optical beam in the optical cavity $B_1$ and the phase of the optical beam in the optical cavity $B_2$ coincide with each other, indicating that there is established a constructive interference of the two optical beams in the gain region 10a. In other words, FIGS. 2(A) and 2(B) show the case wherein the laser diode produces a strong coherent optical beam.

FIG. 3 shows various longitudinal modes of laser oscillation that correspond to various standing waves formed in an optical cavity. As is well known in the art, a laser diode having an optical cavity oscillates at discrete wavelengths in correspondence to the standing waves that are established in the optical cavity. Thereby, each mode is separated from the adjacent mode by a frequency Δν that is given as $$\Delta\nu = c/2nL. \tag{1}$$

where c represents the speed of light in the vacuum, n represents the refractive index of the medium that forms the optical cavity, and L represents the axial length of the optical cavity. The foregoing relationship can be rewritten in terms of the wavelength λ of the optical beam such that:

$$\Delta\lambda = \lambda^2/2nL. \tag{2}$$

where Δλ represents the wavelength separation between the adjacent modes. Eq. (2) indicates that the wavelength separation Δλ is determined by the wavelength λ of the optical beam, the refractive index n and the length L of the optical cavity. It should be noted that the refractive index n is included in the denominator of Eq. (2).

On the other hand, the oscillation wavelength of each longitudinal mode is given as:

$$\lambda_m = 2nL/M \tag{3}$$

where m represents the order of the mode.

Eq. (3) indicates that the wavelength $\lambda_m$ is proportional to the refractive index n of the optical cavity. In other words, the wavelength $\lambda_m$ changes linearly with the change of the refractive index n while maintaining a generally constant wavelength separation Δλ from the adjacent modes. This feature will he noted in the explanation given below concerning the interference of two optical beams in the branched optical cavity.

Referring to FIG. 3 again, a curve g represents the gain spectrum of the laser diode. Further, FIG. 3 shows also a cavity loss for each mode. Thus, it will be understood that each longitudinal mode has an optical gain and a cavity loss that are pertinent thereto. When the laser diode is biased to a level below the oscillation threshold, each optical mode has an optical gain that is proportional to the gain spectrum g. With increasing injection current, the optical gain increases. Thus, once the gain of one mode has exceeded the cavity loss, the laser oscillation starts at this mode. There, the gain spectrum is fixed at the state where the laser oscillation started first, and the optical amplification for the other mode is suppressed. Thus, the laser oscillation occurs selectively at the mode that initially started the oscillation, even when the injection of the carriers is increased thereafter.

Next, the interference of two optical beams produced in the laser diode of FIG. 1 in correspondence to the optical cavities $B_1$ and $B_2$ respectively will be examined with reference to FIGS. 4 and 5.

Referring to FIG. 4, the spectrum of the first optical cavity $B_1$ includes the modes m1, m1±1, m1±2, . . . , and the spectrum is superposed on the spectrum of the second optical cavity $B_2$ that includes the modes m2, m2±1, m2±2, . . . There, each mode of the first optical cavity $B_1$ is separated from each other such mode by a wavelength separation $\Delta\lambda_1$, while each mode of the second optical cavity $B_2$ is separated from each other such mode by a wavelength separation $\Delta\lambda_2$. It should be noted that the wavelength of the m1-th mode of the first optical cavity $B_1$ and the wavelength of the m2-th mode of the second optical cavity $B_2$ coincide with each other at a wavelength $\lambda_0$ ($\lambda_{m1}=\lambda^{m2}=\lambda_0$). Further, in correspondence to Eq. (2), the wavelength separation between the adjacent modes in the first optical cavity $B_1$ is represented as $$\Delta\lambda_1 = \lambda_0^2/2n_1L_1$$

where $n_1$ and $L_1$ represent respectively the refractive index and the effective length of the optical cavity $B_1$, while the wavelength separation in the second optical cavity $B_2$ is represented as:

$$\Delta\lambda_2 = \lambda_0^2/2n_2L_2$$

where $n_2$ and $L_2$ represent respectively the refractive index and the effective length of the optical cavity $B_2$.

FIG. 5 shows the wavelength of the various modes formed in the first and second optical cavities $B_1$ and $B_2$ of the tunable laser diode of FIG. 1 while changing the refractive index $n_2$ of the optical cavity $B_2$ with respect to the refractive index $n_1$ of the optical cavity $B_1$. There, the refractive index $n_1$ is held constant. It should be noted that the relationships of FIG. 5 are obtained for the tunable laser diode that has a length $L_1$ of 343 μm for the optical cavity $B_1$ and a length $L_2$ of 347 μm for the optical cavity $B_2$, with the length of the part 10a set to 200 μm, the length of the part 10b set to 143 μm, the length of the part 10c set to 147 μm.

Referring to FIG. 5, it will be noted that the wavelength $\lambda_{2m\pm i}$ of the mode 2m±i (i=1, 2, 3 . . . ) changes linearly with the change of the refractive index $n_2$ represented as $\Delta n_2$. On the other hand, the wavelength $\lambda_{1m\pm i}$ of the mode 1m±i (i=1, 2, 3, . . . ) does not change as represented by the vertical lines. Further, it should he noted that the wavelength separation $\Delta\lambda_2$ in the cavity $B_2$ is set slightly smaller than the wavelength separation $\Delta\lambda_1$ in the cavity $B_1$ ($\Delta\lambda_1 - \Delta\lambda_2 = 0.01$ nm). Thereby, there appear a number of intersections as represented by the solid circles wherein the phase of the optical beam in the optical cavity $B_1$ coincides with the phase of the optical beam in the optical cavity $B_2$. In other words, the solid circles represent the wavelengths of the optical beam that the tunable laser diode of FIG. 1 produces. By changing the refractive index $n_2$, the actual oscillation wavelength of the laser diode changes along the lines such as a line C shown in FIG. 5 that connects the solid circles. There, the line C connects the solid circles E, M, O and J, wherein the solid circle E corresponds to the wavelength $\lambda_0$. In FIG. 5, it should be noted that there are actually one hundred $\lambda_{m1}$ modes included between the wavelength of 1.55 μm that corresponds to $\lambda_0$ and the wavelength of 1.65 μm, and between the wavelength of 1.45 μm to the wavelength of 1.55 μm. The illustration of all these modes is not attempted, as such an illustration would excessively complicate the drawing.

The relationship of FIG. 5 indicates that one can achieve a change of the wavelength of the optical beam produced by the laser diode of FIG. 1 of as much as 100 μm by merely changing the refractive index $n_2$ by about 0.15%. It should be noted that a change of the refractive index of this magnitude is caused in response to a very small change of the wavelength $\lambda_{2m\pm i}$, of only 0.99 nm, in the second optical cavity $B_2$. By combining with the first optical cavity $B_1$ and by using the interference of the optical beams in the first and second cavities $B_1$ and $B_2$, the range of the wavelength shift is significantly expanded.

In FIG. 5, it will be noted that there exist a plurality of oscillation modes for each given refractive index $n_2$. For example, when the refractive index change $\Delta n_2$ is zero, the laser oscillation can occur at the wavelengths corresponding to the points A, E and I. When the parameter $\Delta n_2$ is set to 0.15%, the laser oscillation can occur at the points B, F and J. In the actual device of FIG. 1, the laser oscillation occurs only at one point for a given $\Delta n_2$, because of the gain spectrum as will be described below.

FIG. 6 shows a typical gain spectrum of the laser diode of FIG. 1. It should be noted that the gain spectrum itself is related to the material that forms the active layer of the laser diode, not to the structure of the optical cavity.

Referring to FIG. 6 again, it will be noted that the oscillation can occur at any of the points A, E and I when the parameter $\Delta n_2$ is set to zero as already mentioned. On the other hand, the gain spectrum (a) of FIG. 6 indicates that the points A and E have a gain that is smaller than the gain at the point I. Thus, the laser oscillation occurs actually at the single point I, with the wavelength of 1.65 μm. When the injection current is set in correspondence to the gain spectrum (d), the laser oscillation occurs preferentially at the point E where the optical gain is the largest. In other words, as a result of the combination with the gain spectrum of FIG. 6, the laser diode of FIG. 1 having the characteristic of FIG. 5 operates substantially as a single mode tunable laser diode.

In this conventional laser diode, it should be noted that a wavelength change that exceeds 100 nm cannot be achieved. For example, when the parameter $\Delta n_2$ is increased from zero, the oscillation wavelength of the laser diode increases along the line E-J of FIG. 5 until it reaches a wavelength value corresponding to the point N. Here, the gain spectrum (d) of FIG. 6 is assumed. When the wavelength has exceeded the point N and reached the point O, it will be understood from the gain spectrum (d) of FIG. 6 that the gain of the point P located at the shorter wavelength side of the point E exceeds the gain of the point O. There, the oscillation wavelength jumps from the point O to the point P. Thereby, the wavelength decreases by about 100 nm. In other words, the wavelength change that is achieved by the device of FIG. 1 is limited in the range changes between the point P and point M and cannot exceed 100 nm even when the refractive index $n_2$ of the second optical cavity $B_2$ is changed by 0.15% or more. It will be noted from FIG. 5 that a similar jump of the oscillation wavelength would be repeated between other lines such as the line A-K and the line B-L.

SUMMARY OF THE INVENTION

Accordingly, it is a general object of the present invention to provide a novel and useful tunable laser diode, wherein the foregoing problems are eliminated.

Another and more specific object of the present invention is to provide a tunable laser diode having a branched optical cavity, wherein a large shift of oscillation wavelength is achieved as a result of interference of optical beams in the branched optical cavity.

Another object of the present invention is to provide tunable laser diode, comprising: first reflection means for reflecting an optical beam; second reflection means for reflecting an optical beam; optical cavity means extending between said first reflection means and said second reflection means for establishing an optical resonance by transmitting an optical beam therethrough, said optical cavity means comprising a first waveguide part having a first end connected to said first reflection means and a second, opposite end and exchanging an optical beam with said first reflection means, a second waveguide part having a first end connected to said second reflection means and a second, opposite end and exchanging an optical beam with said second reflection means, a third waveguide part connecting said second end of said first waveguide part and said second end of said second waveguide part with each other for passing a first optical beam between said first and second reflection means, and a fourth waveguide part connecting said first end of said first waveguide part and said second end of said second waveguide part separately from said third waveguide part for passing a second optical beam between said first and second reflection means, said third and fourth waveguide parts merging with each other at said second end of said first waveguide part, said third and fourth waveguide parts merging with each other at said second end of said second waveguide part, said first waveguide part, said second waveguide part and said third waveguide part forming a first optical path having a first optical path length between said first and second reflection means, said first waveguide part, said second waveguide part and said fourth waveguide part forming a second optical path having a second optical path length that is different from said first optical path length between said first and second reflection means; optical amplification means provided at least on one of said first and second waveguide parts of said optical cavity means for amplifying an optical beam that passes therethrough; and refractive index modulation means provided on said third and fourth waveguide parts of said optical cavity means for changing a refractive index of said third waveguide part and a refractive index of said fourth waveguide part relative to each other.

According to the present invention, the phase of the optical beams become equal in the first and second waveguide parts of the optical cavity means. In other words, the first optical beam in the first optical path and the second optical beam in the second optical path have the same phase throughout the optical cavity means. When the first optical beam has a phase different from the phase of the second optical beam in any of the first and second waveguide parts of the optical cavity means (see FIGS. 2(A) and 2(B)), the optical beams are inevitably canceled out. In the prior art device of FIG. 1, these optical beams are not canceled out because of the Y-shaped or branched construction of the optical cavity. As the optical beams that have an asynchronous phase relationship in the first and second optical paths are canceled out in the device of the present invention, the modes shown in FIG. 5, for example by the lines E-J or B-L are eliminated. In other words, the wavelength separation between the modes is double the wavelength separation in FIG. 5. Thereby, the range in which the tunable laser diode can change the oscillation wavelength is doubled.

Other objects and further features of the present invention will become apparent from the following detailed description when read in conjunction with the attached drawings.

DETAILED DESCRIPTION OF THE PREFERRED EMBODIMENT

Figure 7:
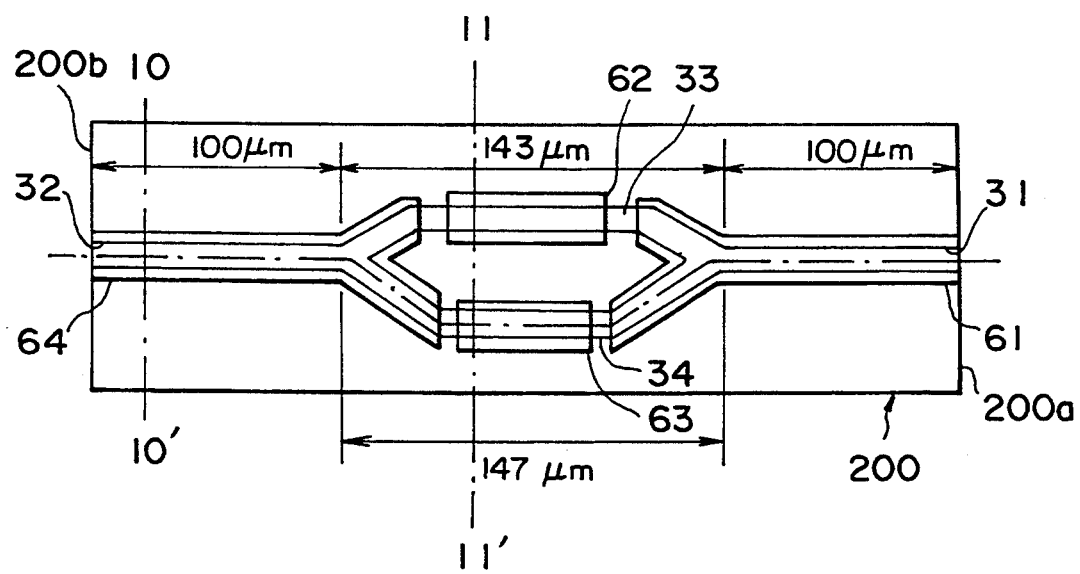
FIG. 7 is a diagram showing the structure of a tunable laser diode according to a first embodiment of the present invention.

FIG. 7 shows a tunable laser diode 20, that corresponds to a first embodiment of the present invention, in a plan view.

Referring to FIG. 7, the laser diode 20 is constructed based upon a layered semiconductor body 200 to be described in detail later, wherein the semiconductor body 200 has a rectangular shape defined by a pair of opposing cleaved surfaces 200a and 200b acting as the mirrors of the optical cavity. In the semiconductor body 200, there is provided a first optical waveguide region 31 extending in the longitudinal direction of the semiconductor body from the cleaved surface 200a toward the opposite cleaved surface 200b. Similarly, a second optical waveguide region 32 is provided so as to extend in the longitudinal direction from the cleaved surface 200b toward the opposite cleaved surface 200a.

There, the first optical waveguide 31 is branched into a first branch and a second branch, while the second optical waveguide 32 is also branched into a first branch and a second branch. Further, there are provided a third optical waveguide 33 connecting the first branch of the first waveguide 34 and the first branch of the second waveguide 31, and a fourth optical waveguide 34 connecting the second branch of the second optical waveguide 32 and the second branch of the first optical waveguide 31. Thereby, there are formed two optical beam paths, one passing through the optical waveguide 33 and the other passing through the optical waveguide 34. In each optical path, the optical beam is reflected back and forth between the cleaved surfaces 200a and 200b, and establishes a resonance as will be described later. In the present embodiment, the first and second waveguides 31–32 extend for a length of 100 μm, while the third and fourth optical waveguides 33 and extends for a length of 147 μm.

In correspondence to the first optical waveguide 31, a gain region of the laser diode is formed as represented in FIG. 7 by an electrode 61. Similarly, another gain region is formed in correspondence to the second optical waveguide 32 as represented by an electrode 64. Thereby, these gain regions are injected with carriers and amplify the optical beam by the stimulated emission as the optical beam is reflected back and forth between the mirror surfaces 200a and 200b. Further, in correspondence to the third and fourth optical waveguides 33 and 34, there are provided electrodes 62 and 63 for injecting carriers. In response to the injection of the carriers, the refractive indices of the optical waveguides 33 and 34 changes.

Figure 8:
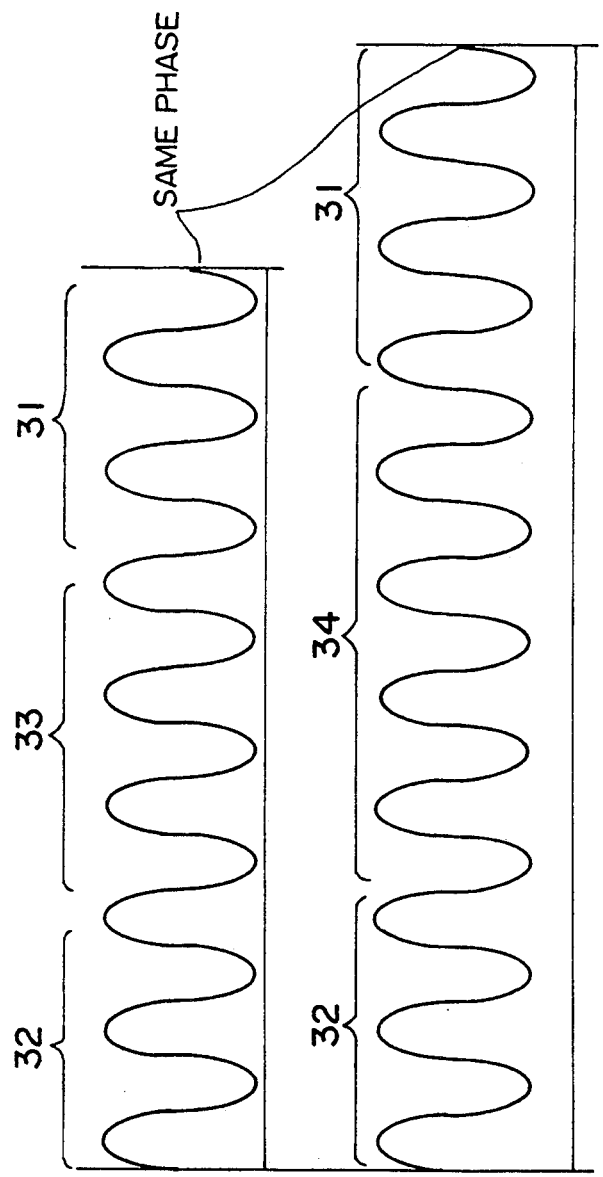
FIGS. 8(A) and 8(B) are diagrams showing the resonance of the optical beams in the device of FIG. 7.

FIGS. 8(A) and 8(B) show the resonance occurring in the first and second optical paths. As already noted, the first optical path includes the optical waveguides 31, 32 and 33, while the second optical path includes the optical waveguides 31, 32 and 34. It will be noted that the phase of the optical beam in the first optical path and the phase of the optical beam in the second optical path coincide with each other particularly in the first and second optical waveguides 31 and 32, as these parts are provided commonly. When the two optical beams have respective phases that are inverted with respect to each other in the optical waveguide region 31, as in the case of FIGS. 2(A) and 2(B), the optical beams would cancel each other, in the waveguide region 31, and the laser diode would not oscillate. In other words, the laser diode of FIG. 7 eliminates the oscillation mode as shown in FIGS. 2(A) and 2(B).

Figures 1, 2A, 2B:
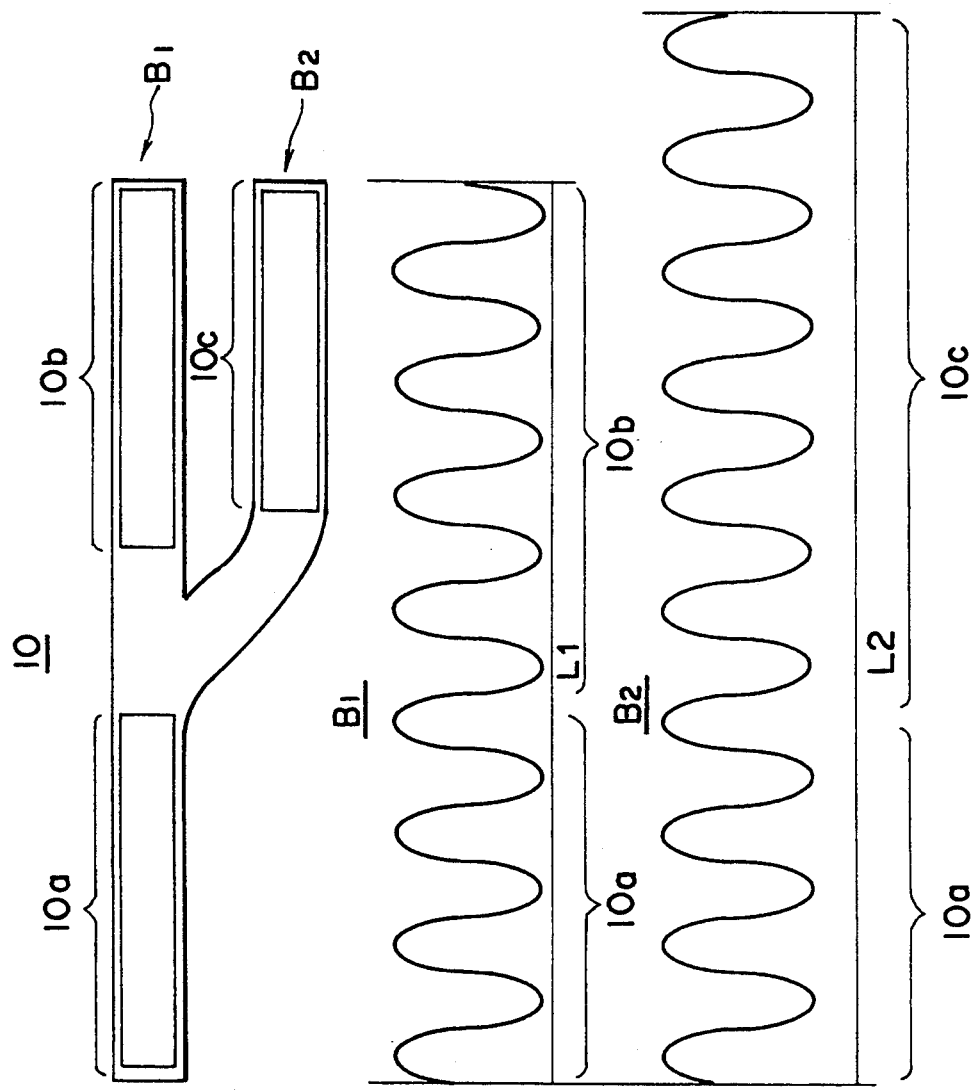
FIG. 1 is a diagram showing the structure of a conventional tunable laser diode in a plan view.
FIGS. 2(A) and 2(B) are diagrams showing the resonance of optical beams in the device of FIG. 1.
Figure 3:
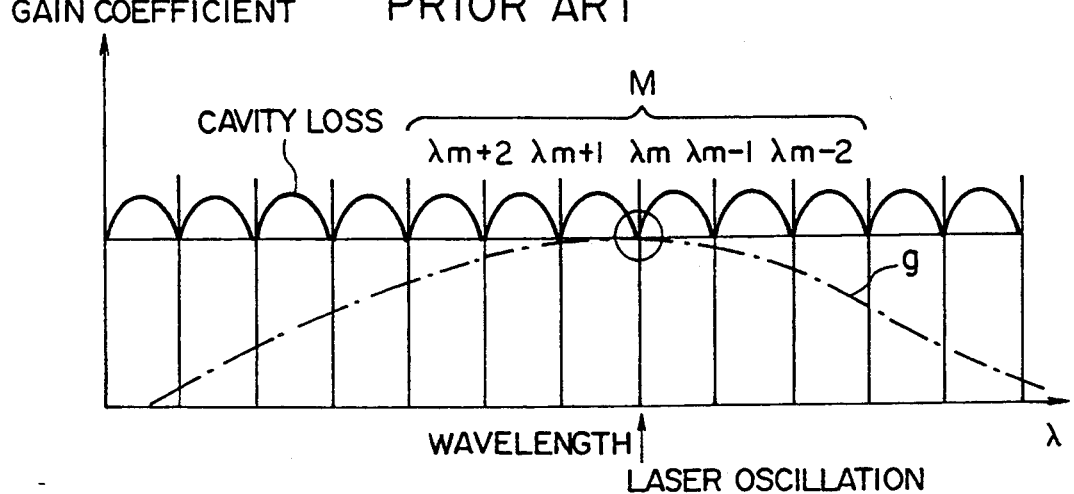
FIG. 3 is a diagram showing the spectrum of various oscillation modes that are established in the device of FIG. 1.
Figure 4:
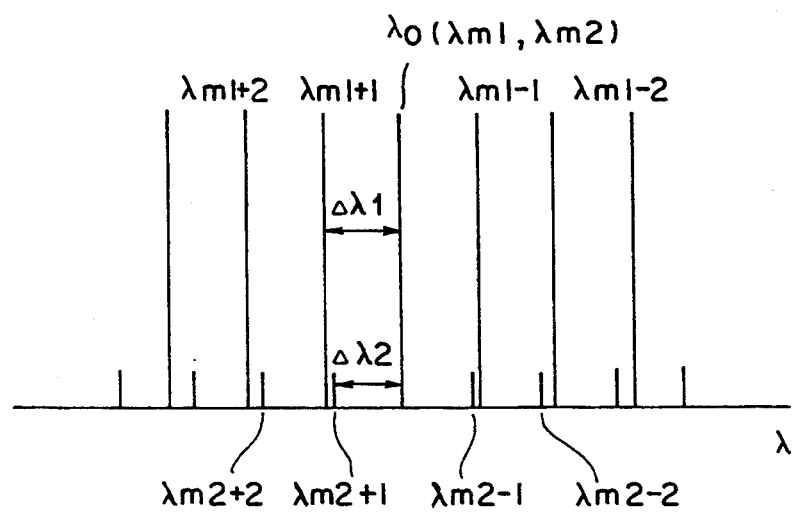
FIG. 4 is a diagram showing the interference of optical beams caused in the device of FIG. 1.

It should be noted that, in the prior art device of FIG. 1, the branches 10b and 10c are separated. Thus, even when the phase of the optical beam is inverted in the branch 10b and in the branch 10c, the optical beams can establish a constructive interference in the gain region 10a and the laser diode oscillates. By changing the refractive index of the branch 10b or branch 10c, the effective optical length $L_1$ or $L_2$ defined in FIGS. 2(A) and 2(B) is changed, and the phase relationship of the optical beam between the branch 10b and the branch 10c is inverted each time the resonant wavelength in the optical cavity $B_2$ changes by 0.01 nm.

In the device 20 of FIG. 7, such an inversion of the phase of the optical beams does not occur because of the use of the common optical waveguides 31 and 32 as well as the common mirrors 200a and 200b. Thereby, the separation between the modes that cause the laser oscillation is increased to be two times as large as the prior art device of FIG. 1.

Figure 9:
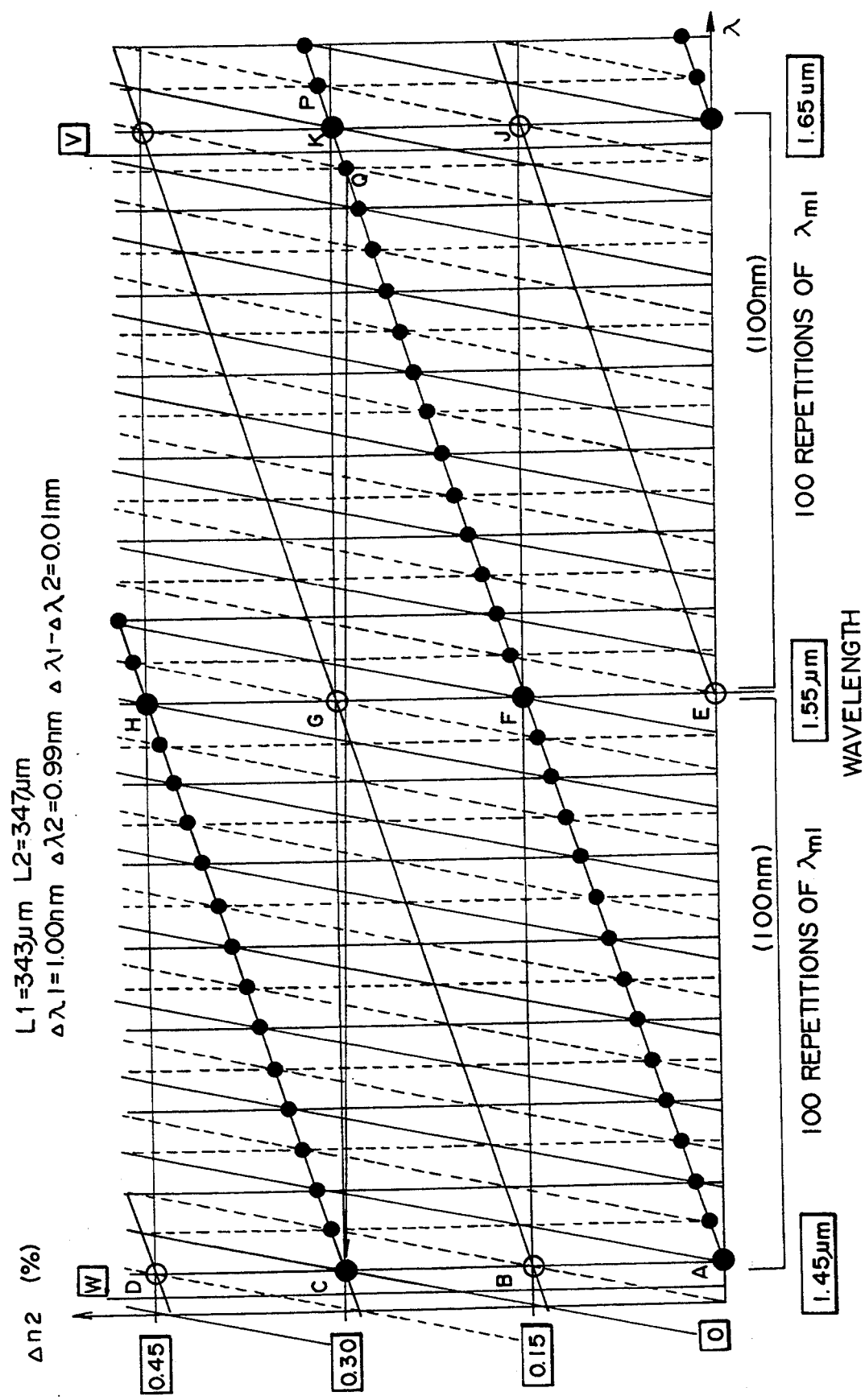
FIG. 9 is a diagram showing the operational principle of the tunable laser diode of FIG. 7.

FIG. 9 shows the principle of the wavelength tuning of the device of FIG. 7.

Figure 5:
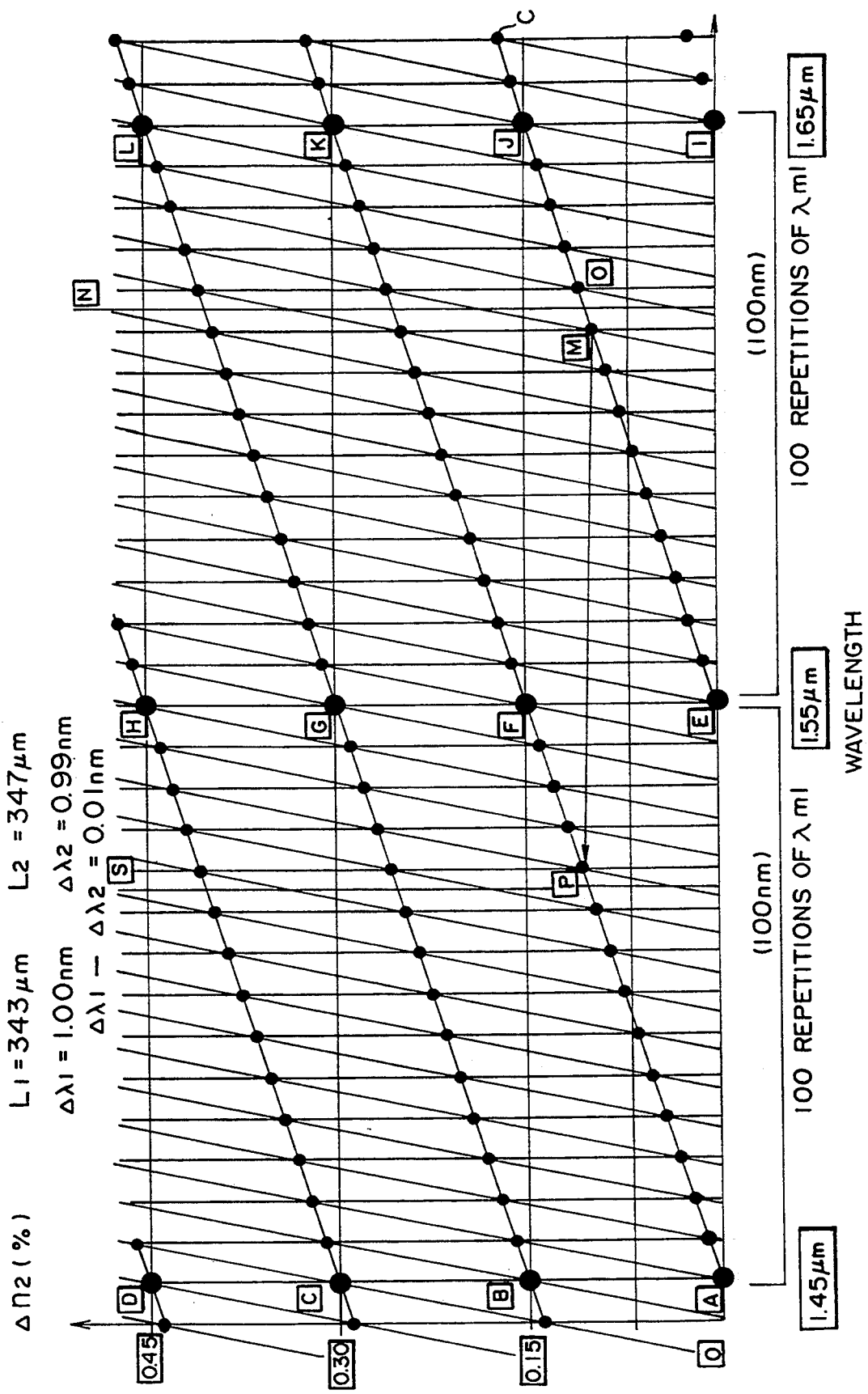
FIG. 5 is a diagram showing the principle of wavelength tuning in the laser diode of FIG. 1.
Figure 6:
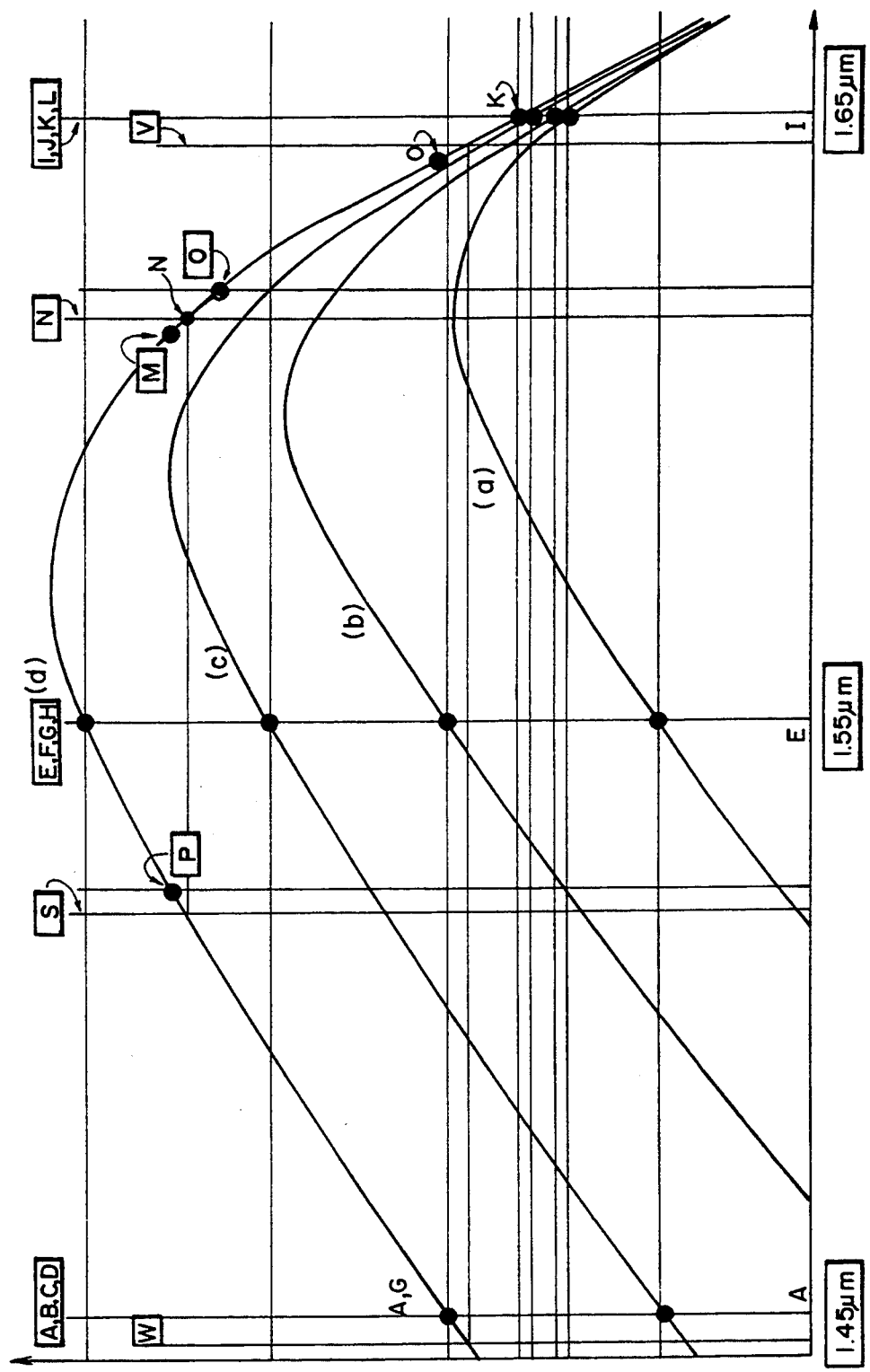
FIG. 6 is a diagram showing the gain spectrum of the device of FIG. 1.

Referring to FIG. 9, the diagram is substantially identical with FIG. 5 except that the vertical and oblique lines, representing respectively the resonance mode in the first optical path and in the second optical path, are represented by an alternate repetition of a continuous line land a broken line. There, the mode represented by the continuous line and the mode represented by the broken line have mutually inverted phases of the optical beams.

Thus, when a vertical line represented by the continuous line and an oblique line represented by the continuous line intersect with each other, there occurs a constructive interference as represented by a solid circle, and the laser diode oscillates. Similarly, when a vertical line represented by the broken line and an oblique line represented by the broken line intersect with each other, there occurs a constructive interference as represented by a shaded circle and the laser diode oscillates. On the other hand, when a vertical line represented by the continuous line and an oblique line represented by the broken line intersect with each other, there occurs a destructive interference as represented by an open circle, and the laser oscillation does not occur. Further, when a vertical line represented by the broken line and an oblique line represented by the continuous line intersect with each other, there occurs also a destructive interference as represented by an open circle.

In FIG. 9, it will be noted that there are defined lines such as a line A-F-K or a line C-H that represent the laser oscillation. It should be noted that the line A-F-K of FIG. 9 corresponds to the line A-F-K of FIG. 5, the line C-H of FIG. 9 corresponds to the line C-H of FIG. 5. On the other hand, FIG. 9 indicates a line B-G-L or a line E-J as the line corresponding to the operational point where the laser oscillation does not occur. In FIG. 5, on the contrary, the line B-G-L or the line E-J represent the operational point where the laser oscillation occurs.

From FIG. 9 it will he noted that the wavelength separation between the adjacent modes of laser oscillation is doubled as compared with the device of FIG. 1. For example, the point K on the line A-F-K and the point C on the line C-H are separated by a wavelength of 200 nm. Between the points C and K, no laser oscillation mode exists. Thereby, the maximum range of the wavelength tuning that can he achieved by the device of FIG. 7 is doubled as compared with the prior art device of FIG. 1. In FIG. 9, it will he noted that the wavelength shift of 200 nm is achieved by a refractive index change $\Delta n_2$ of only 0.3%.

Next, the structure of the tunable laser diode of FIG. 7 will be described in more detail with reference to various cross sections taken along the layered body 200 that forms the device 20.

Figure 10:
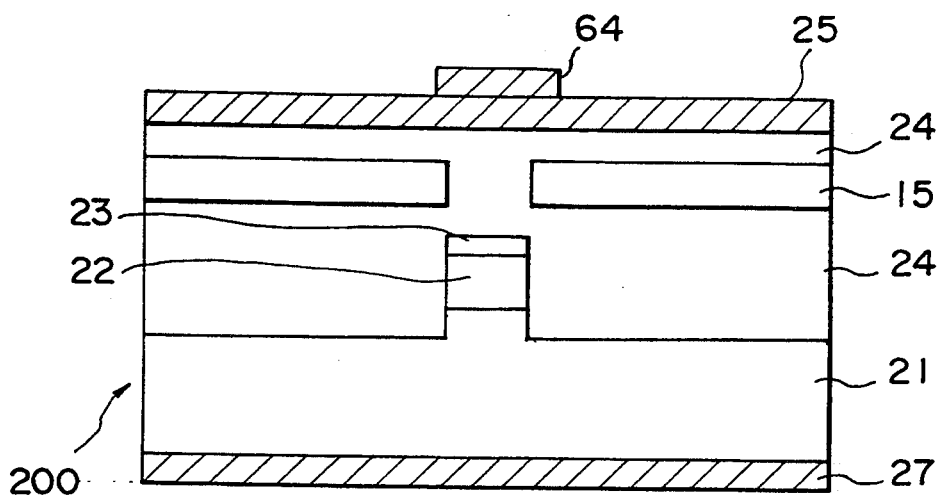
FIG. 10 is a diagram showing the cross section of the tunable laser diode of FIG. 7 taken along a line 10-10' of FIG. 7.

FIG. 10 shows the transverse cross section of the device 20 taken along a line 10-10' shown in FIG. 7. It will be noted from FIG. 7 that the cross section of FIG.

10 shows the second optical waveguide 32. The first optical waveguide 31 has substantially the same structure.

Referring to FIG. 10, the layered body 200 includes a substrate 21 of single crystal InP doped to the n-type with the impurity concentration level of $2 \times 10^{18} \text{cm}^{-3}$. The substrate 21 has a thickness of 100 μm and extends in the longitudinal direction from the surface 200a to the surface 200b with a length of 300 μm. The substrate 200 is formed further, with a mesa structure in correspondence to the central part of the upper major surface such that the mesa structure extends in the longitudinal direction with a length of 100 μm in correspondence to the length of the optical waveguide 32.

On the mesa structure, there is provided a first clad layer 22 of InP doped to the n-type with the impurity concentration level of $5 \times 10^{17} \text{cm}^{-3}$. The first clad layer 22 is grown on the substrate 21 epitaxially with a thickness of 1.5 μm. In correspondence to the mesa structure, the first clad layer 22 extends in the longitudinal direction of the substrate 21 with a length of 100 μm.

On the clad layer 22, there is provided an active layer 23 of undoped InGaAsP with a thickness of 0.2 μm. The active layer 23 is grown epitaxially on the clad layer 22 and extends in the longitudinal direction of the substrate 21 in correspondence to the clad layer 22, with a length of 100 μm. The composition of the active layer 23 is such that the layer 23 has a band gap energy of 0.8 eV or a band gap wavelength $\lambda_g$ of 1.55 μm. It should be noted that one can use also GaAlAs for the material of the active layer 23.

On the active layer 23, there is provided a second clad layer 24 of InP doped to the p-type with an impurity concentration level of $5 \times 10^{17} \text{cm}^{-3}$. The second clad layer 24 is provided, in contact with the exposed upper major surface of the substrate 21 with a thickness of 1.5 μm, to bury the mesa structure, including the clad layer 22 and the active layer 23, underneath. Further, there is provided a carrier blocking layer 15 of InP doped to the n-type with an impurity concentration level of $5 \times 10^{17} \text{cm}^{-3}$ such that the carrier blocking layer 15 protrudes laterally from opposite sides at a level above the active layer 23. The layer 15 is provided such that there is formed a passage for the carriers, in correspondence to the active layer 23. It should be noted that the n-type carrier blocking layer 15 forms a depletion region in correspondence to the p-n junction that is formed between the layer 15 and the n-type clad layer 24. Thus, the layer 15 prevents the carriers injected into the clad layer 24 from flowing directly to the substrate 21.

On the upper major surface of the clad layer 24, there is provided a contact layer of p-type InP having a thickness of 0.5 μm and an impurity concentration level of $2 \times 10^{18} \text{cm}^{-3}$, and the ohmic electrode 64 shown in FIG. 7 is formed on the contact layer 25. Further, another ohmic electrode 27 is provided on the lower major surface of the substrate 21. It should be noted that the electrode 64 is patterned in correspondence to the pattern of the active layer 23, while the electrode 27 covers the entire lower major surface of the substrate 21.

In operation, holes are injected to the clad layer 24 via the contact layer 25 upon application of a positive bias voltage to the electrode 64. Simultaneously, electrons are injected to the substrate 21 by applying a negative bias voltage to the electrode 27. Thereby, the holes are concentrated in the region corresponding to the passage that is formed by the blocking layer 15 as they flow toward the opposing electrode 27, and are injected into the active layer 23 efficiently. There, the holes cause recombination in the active layer 23 with the electrons that are injected to the layer 23 from the substrate 21 via the clad layer 22. Such a recombination of carriers releases the optical radiation, and the optical radiation is amplified by the stimulated emission as it is reflected back and forth in the optical cavity of the laser diode. It should be noted that the optical waveguide 31 has a structure substantially identical with the structure of FIG. 10. Thus, the description thereof will he omitted.

Figure 11:
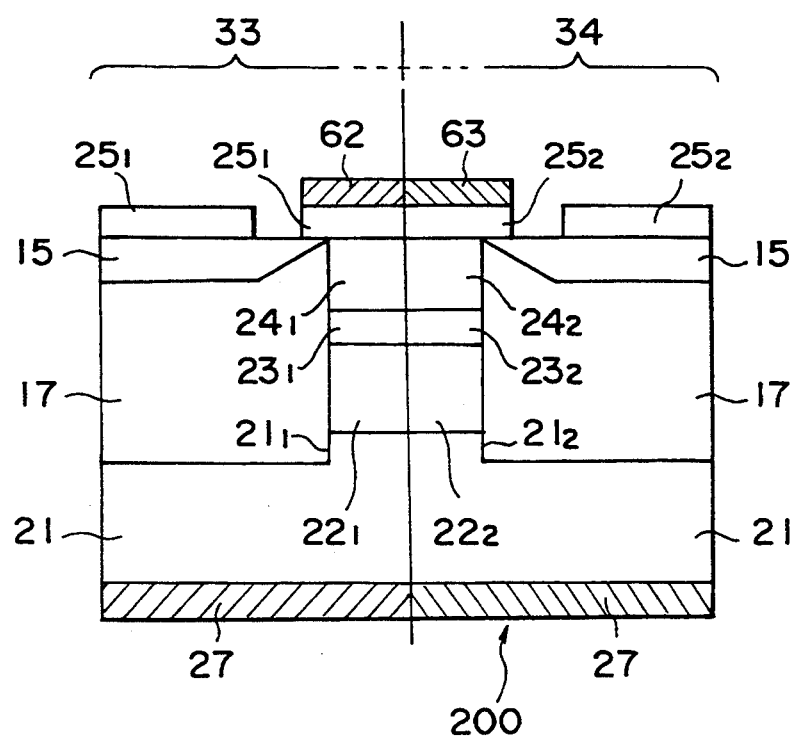
FIG. 11 is a diagram showing the longitudinal cross section of the optical cavity used in the laser diode of FIG. 7.

Next, the structure of the optical cavity will be described with reference to FIG. 11 that shows the cross section of the third and fourth optical waveguides 33 and 34. As will be noted in FIG. 7, the optical waveguide 31 or 32 is branched into the optical waveguides 33 and 34 formed in correspondence to the region located between the optical waveguide 31 and the optical waveguide 32. FIG. 11 shows, in the left-half part of the diagram, the structure of the optical waveguide 33. On the other hand, the right-half part of FIG. 11 shows the structure of the optical waveguide 34.

Referring to FIG. 11, the optical waveguide 33 has a branched mesa structure $21_1$ in the substrate 21 as one of the branches of the mesa structure of FIG. 10, and there is provided a branched clad layer $22_1$ on the branched mesa structure $21_1$ as a branch of the clad layer 22. Thus the clad layer $22_1$ has a thickness and composition identical with the clad layer 21 of FIG. 10. On the branched clad layer $22_1$, there is provided a branched active layer $23_1$ as a branch of the active layer 23, with the composition and thickness identical with those of the active layer 23. Further, there is provided a branched contact layer $24_1$ on the branched active layer $23_1$ as a branch of the contact layer 24. There, the layer $24_1$ has a composition and thickness identical with those of the layer 24.

The layers $21_1$–$24_1$ are supported laterally by an n-type InP buried layer 17, and the surface of the layer 17 is covered by the current blocking layer 15. It should be noted that the current blocking layer 15 is provided only on the upper major surface of the buried layer 17 and has an upper major surface that is flush with the upper major surface of the clad layer $24_1$.

On the upper major surface of the clad layer $24_1$, there is provided a branched contact layer $25_1$ as a branch of the contact layer 25, and the ohmic electrode 62 is provided on the contact layer 25 as shown in the plan view of FIG. 7. Further, the lower major surface of the substrate 200 is covered by the ohmic electrode 27 described previously with reference to FIG. 10.

In the present embodiment, the construction of the other optical waveguide 34 is made exactly identical with the optical waveguide 33 in terms of the cross section. Only the physical length is changed such that the optical waveguide 34 is longer than the optical waveguide 33 by 4 μm. Thus, the description about the construction of the optical waveguide 34 with reference to the cross sectional diagram of FIG. 11 will be omitted.

In the present embodiment, the refractive index of the optical waveguides 33 and 34 can be changed by applying a bias voltage across the electrode 62 and the electrode 27 or across the electrode 63 and the electrode 27. When a negative voltage is applied to the electrode 27 and a positive voltage is applied to the electrodes 62 and 63 simultaneously, the p-i-n junctions formed by the layers $24_1$, $24_2$, $23_1$, $23_2$ and $22_1$, $22_3$ are biased in the forward direction and the carriers are injected to the active layers $23_1$ and $23_2$. Thereby, the refractive index of the active layer is changed by the plasma effect. By controlling the bias voltages to the electrodes 62 and 63 independently, one can change the refractive index of the active layer $23_2$ with respect to the active layer $23_1$ according to the relationship shown in FIG. 9. Thereby, an extensive wavelength shift of as much as 200 nm can be obtained as already explained.

Figure 12:
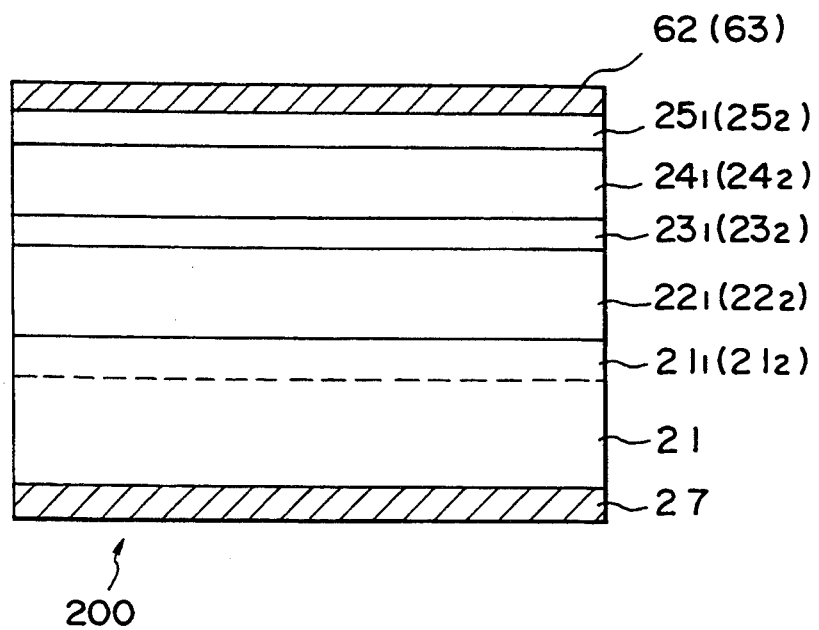
FIG. 12 is a diagram showing the transversal cross section of the tunable laser diode of FIG. 7 along a line 12-12'.

FIG. 12 shows the longitudinal cross section of the layered body 200 that forms the optical waveguide 33. As shown in FIG. 12, the optical waveguide 33 is formed on the mesa structure $21_1$ of the InP substrate 21, and has the layered structure as illustrated. Each of the layers are of course grown epitaxially on the substrate 21. As the process for growing epitaxial layers and the process for forming the structure of FIG. 11 from the structure of FIG. 12 are well known in the art of laser diode, the description of the fabrication process of the device of FIG. 7 will be omitted. It should be noted that the optical waveguide 34 also has the longitudinal cross section substantially identical with the optical waveguide 33.

Figure 13:
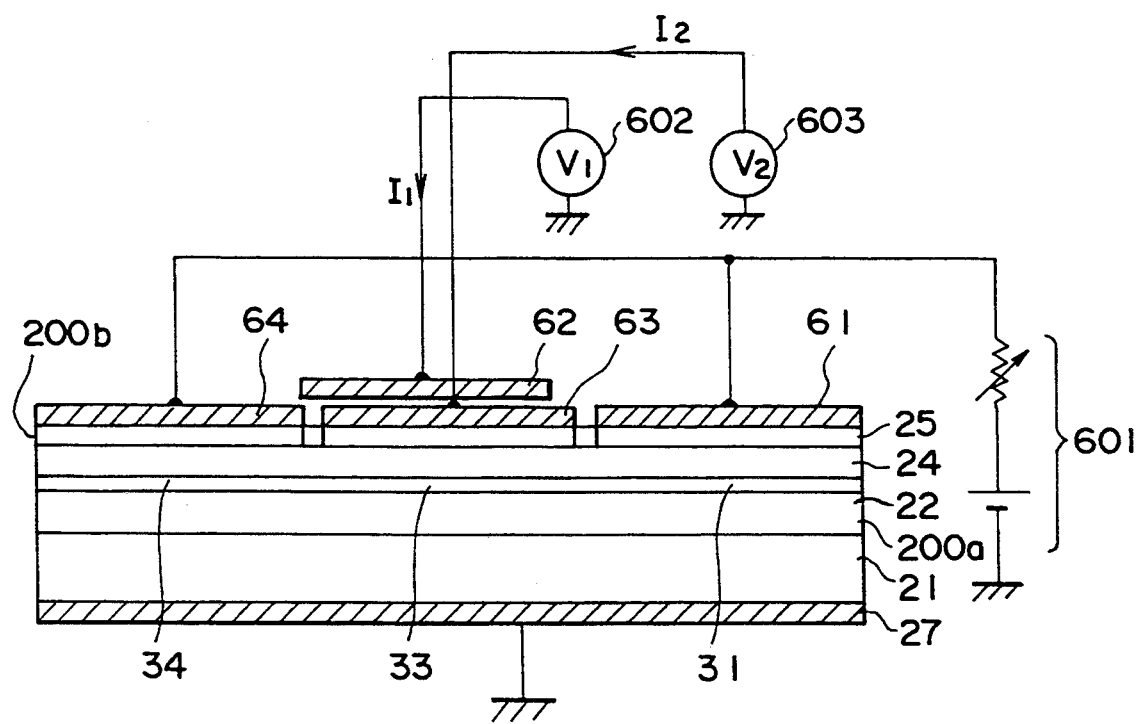
FIG. 13 is a diagram showing the biasing of the tunable laser diode of FIG. 7.

FIG. 13 shows the longitudinal cross section of the tunable laser diode of FIG. 7 taken along the optical path represented by a one-dotted chain line, together with various voltage sources for driving as well as controlling the laser diode.

Referring to FIG. 13, there is provided a d.c. voltage source 601 connected across the electrode 64 and the electrode 27 as well as across the electrode 61 and the electrode 27, for supplying a forward bias voltage to the electrodes 61 and 64 for sustaining the laser oscillation. Further, there is provided a voltage source 602 connected across the electrodes 62 and 27 for injecting a current $I_1$ into the optical waveguide 33. Similarly, there is provided a voltage source 603 connected across the electrodes 61 and the electrode 27 for injecting a current $I_2$ into the optical waveguide 34. By controlling the current $I_1$ and the current $I_2$ independently, one can control the refractive index of the optical waveguides 33 and 34. For example, the refractive index $n_2$ that corresponds to the refractive index of the optical waveguide 34 can be changed by controlling the injection current $I_2$. By holding constant the refractive index $n_1$ of the optical waveguide 33 during this process by holding the injection current $I_1$ constant, one can realize the tuning operation of the laser diode as explained with reference to FIG. 9.

It should be noted that the voltage sources 602 and 603 may apply a reverse bias voltage to the electrodes 62 and 63. In this case, the desired refractive index change of the optical waveguides 33 and 34 can be achieved by the Franz-Keldysh effect. In this case, too, the voltages applied to the electrodes 62 and 63 are controlled independently by the voltage sources 602 and 603.

Figure 14:
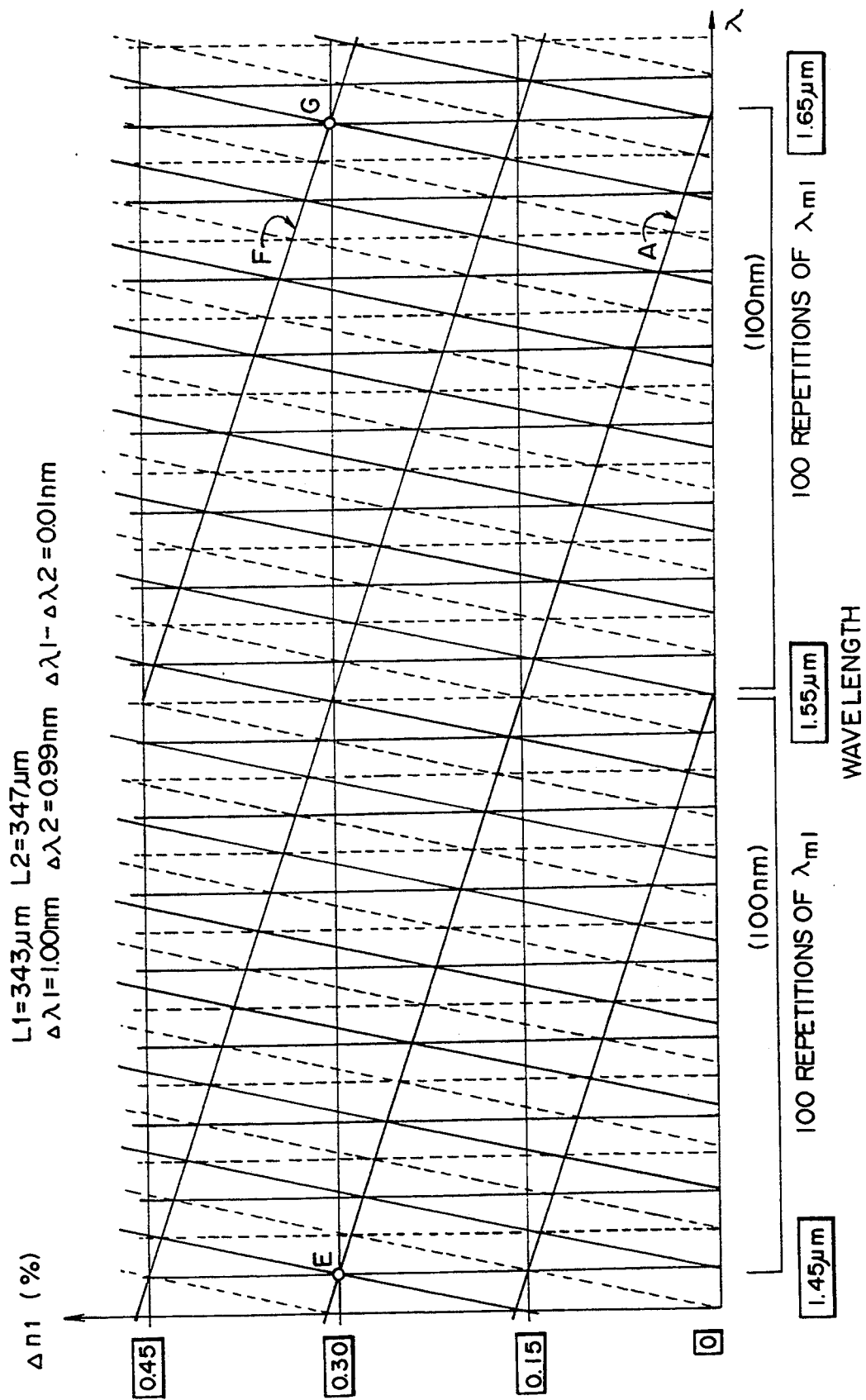
FIG. 14 is a diagram showing the operation of the tunable laser diode of FIG. 7.

FIG. 14 shows the operational chart similar to FIG. 9 for the case where the refractive index $n_2$ of the optical waveguide 34 is fixed and the refractive index $n_1$ of the optical waveguide 33 is varied. In this case, the oscillation wavelength of the laser diode changes along the oblique lines E-A and the lines parallel to it, that have a negative slope. As the operational principle corresponding to FIG. 14 is obvious from FIG. 9 and the related explanation, further description thereof will be omitted.

Figure 15:
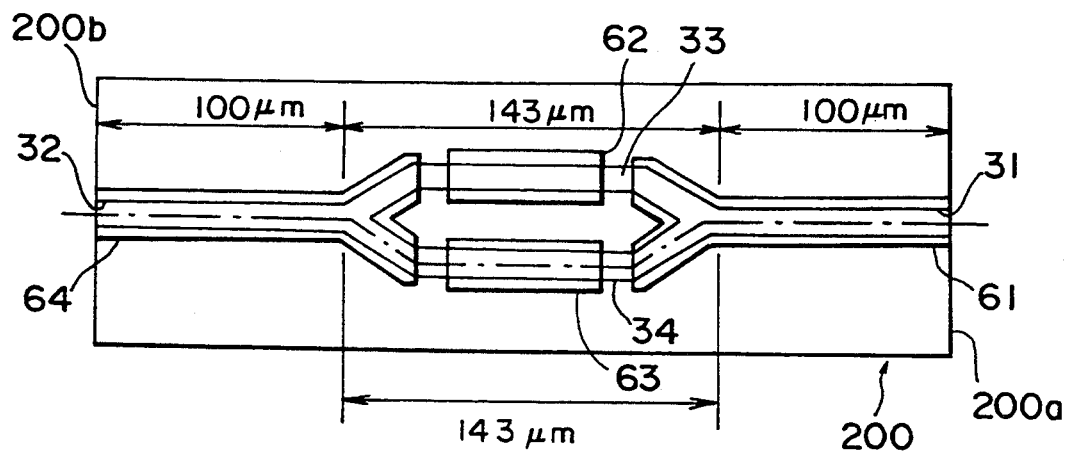
FIG. 15 is a diagram corresponding to FIG. 7 showing a tunable laser diode according to a second embodiment in a plan view.

FIG. 15 shows a tunable laser diode 30 according to a second embodiment of the present invention in the plan view. In the present embodiment, it will be noted that the optical waveguide 33 and the optical waveguide 34 have the same length of 343 $\mu$m in the present embodiment. In other words, the optical waveguide 33 and the optical waveguide 34 are formed symmetrically.

Figure 16:
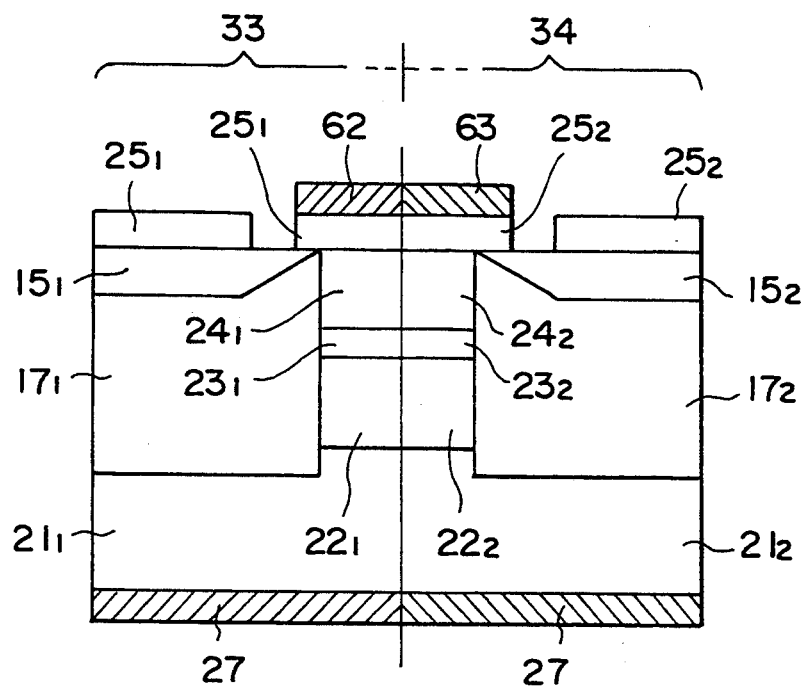
FIG. 16 is a diagram corresponding to FIG. 10 showing the cross section of the tunable laser diode according to a second embodiment of the present invention.

FIG. 16 shows the transversal cross section of the device 30. Referring to FIG. 16, it will be noted that the device 30 has a cross section substantially identical with the device 20 of FIG. 7. On the other hand, the composition of the active layer $23_1$ of the optical waveguide 33 is changed with respect to the composition of the active layer $23_2$ of the optical waveguide 34 in the device 30 of the present embodiment. For example, the composition of the active layer $23_1$ is set such that the active layer $23_1$ has a band gap that is larger than the band gap of the active layer $23_2$. Thereby, the active layer $23_1$ has a refractive index smaller than the refractive index of the active layer $23_2$. When there is a difference in the refractive index in the optical waveguide 33 and in the optical waveguide 34 in the state that there is no bias voltage applied to the electrodes 62 and 63, there still appears a difference in the effective optical length between the optical waveguide 33 and the optical waveguide 34, and the laser diode has an optical cavity substantially identical with the laser diode of FIG. 7, even when the optical waveguides 33 and 34 are formed with the same physical length.

It should be noted that the refractive index of InGaAsP that forms the active layers $23_1$ and $23_2$ increases with decreasing content of P. When GaAlAs is used for the active layers $23_1$ and $23_2$, on the other hand, the refractive index increases with decreasing content of Al. In a typical example, the composition of the active layer $23_1$ is set to $In_{0.625}Ga_{0.375}As_{0.83}P_{0.17}$ while the composition of the active layer $23_2$ is set to $In_{0.619}Ga_{0.381}As_{0.84}P_{0.16}$. Of course, the refractive index of these layers can be changed by injecting the carriers or applying a reverse bias voltage as explained with reference to FIG. 13, and the device 30 of the present embodiment provides a wavelength shift according to the chart explained with reference to FIG. 9 or FIG. 14.

Figure 17:
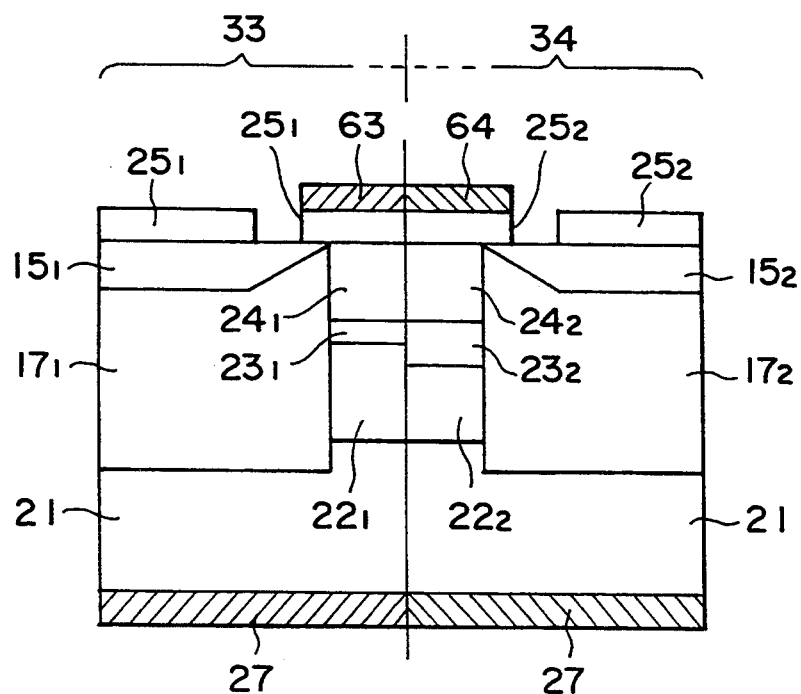
FIG. 17 is a diagram similar to FIG. 16 showing the cross section of the tunable laser diode according to a third embodiment of the present invention.

FIG. 17 shows a tunable laser diode 40 according to a third embodiment of the present invention in the transversal cross sectional view. The device may have a plan view represented in any of FIG. 7 or FIG. 15 and the description of the plan view will be omitted.

Referring to FIG. 17, the device of the present embodiment has the active layer of which thickness is changed in the optical waveguide 33 and the optical waveguide 34. In the illustrated example, the active layer $23_1$ of the optical waveguide 33 has a reduced thickness as compared with the active layer $23_2$ of the optical waveguide 34. In correspondence to the reduced thickness of the active layer $23_1$, the thickness of the clad layer $22_1$ is increased. On the other hand, the thickness of the clad layer $22_2$ of the optical waveguide 34 is reduced in correspondence to the increased thickness of the active layer $23_2$. By reducing the thickness of the active layer, it is known that the averaged refractive index of the optical waveguide is reduced. Similarly, the increase of the thickness of the active layer results in an increase of the averaged refractive index of the optical waveguide. Thereby, the optical waveguide 33 and the optical waveguide 34 have different optical path lengths even when they have the same physical length, and the tunable laser diode 40 operates similarly to the preceding tunable laser diodes 20 and 30. In a typical example, the thickness of the active layer $23_1$ is set to 0.20 μm while the thickness of the active layer $23_2$ is set to 0.22 μm. It should be noted that the active layers $23_1$ and $23_2$ can be grown simultaneously with different thicknesses by the epitaxial process such as MOCVD. See, for example, EP 0 411 145 corresponding to U.S. Ser. No. 07/950,776 filed Sep. 24, 1992, in turn a continuation of U.S. Ser. No. 07/582,209 filed Feb. 1, 1990, incorporated herein as reference.

Figure 18:
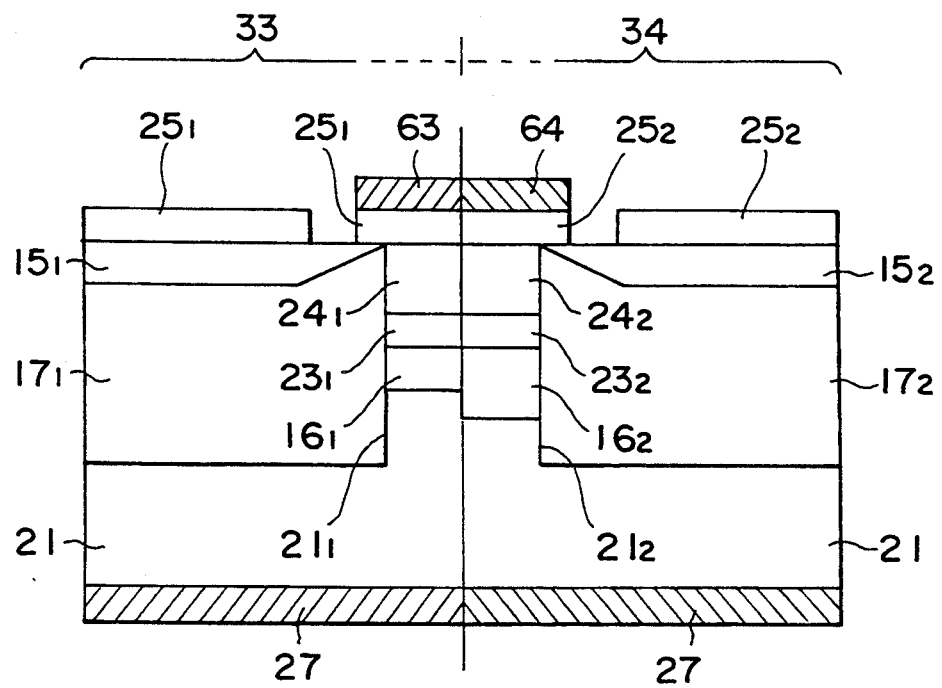
FIG. 18 is a diagram similar to FIG. 17 showing the cross section of the tunable laser diode according to a fourth embodiment of the present invention.

FIG. 18 shows a tunable laser diode 50 according to a fourth embodiment of the present invention in the cross sectional view. As the device 50 has the plan view similar to FIG. 7 or FIG. 15, the description of the plan view will be omitted.

In the cross sectional view of FIG. 18, it will be noted that the height of the mesa structure is changed in the optical waveguide 33 and in the optical waveguide 34. Further there is provided a waveguide layer $16_1$ of InGaAsP between the mesa structure $21_1$ and the active layer $23_1$. Similarly, a similar waveguide layer $16_2$ is provided between the mesa structure $21_2$ and $23_2$. There, the active layer $23_1$ and the active layer $23_2$ have the same thickness while the thickness of the clad layer $16_1$ is changed with respect to the thickness of the clad layer $16_2$ for compensating for the difference in the height of the mesa structures $21_1$ and $21_2$.

There, the waveguide layer $16_1$ has a refractive index smaller than the active layer $23_1$ but larger than the substrate 21. Similarly, the waveguide layer $16_2$ has a refractive index smaller than the active layer $23_2$ but larger than the substrate 21. Thereby, the optical beam is guided along the waveguide layers $16_1$ and $16_2$ as is well known in the art. By changing the thickness of the waveguide layer $16_1$ with respect to the waveguide layer $16_2$, it is possible to change the refractive index between the waveguide layer $16_1$ and the waveguide layer $16_2$. Thereby, the effective optical length of the optical waveguide 33 is changed with respect to the optical waveguide 34 and the device 50 of the present embodiment acts similar to the device of FIG. 7. As already noted, the technique for growing two epitaxial layers simultaneously on a substrate with different thicknesses is already known.

Figure 19:
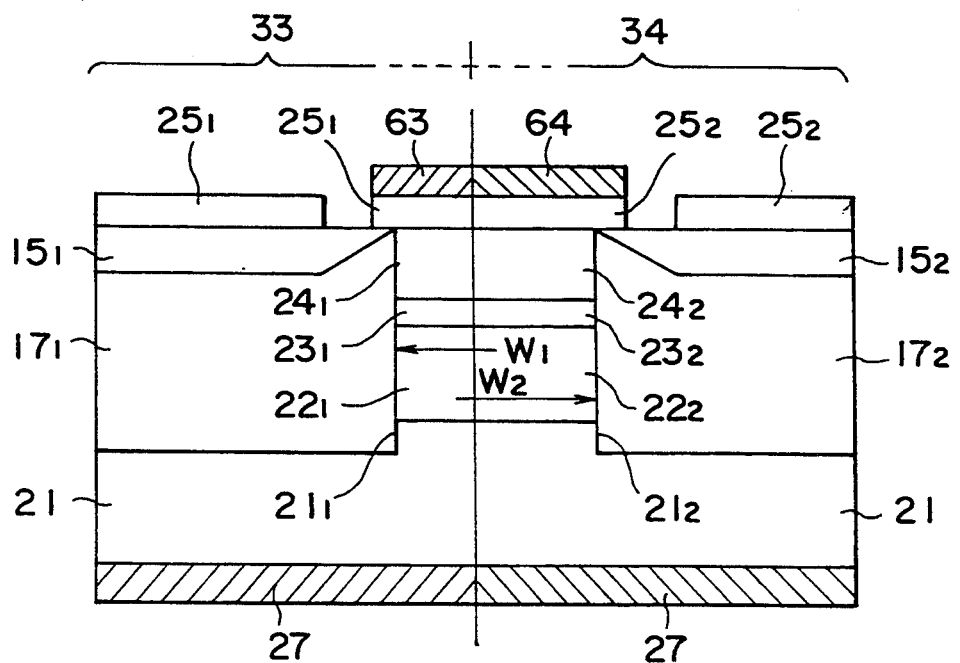
FIG. 19 is a diagram similar to FIG. 18 showing the cross section of the tunable laser diode according to a fifth embodiment of the present invention.

FIG. 19 shows a tunable laser diode 60 according to a fifth embodiment of the present invention. As the device 60 has a plan view similar to the previous devices, only the cross sectional view will be described.

In the device of the present embodiment, it will be noted that the lateral width of the mesa structure and hence the active layer is changed in the optical waveguide 33 and in the optical waveguide 34. Thus, the optical waveguides 33 and 34 have respective lateral widths $W_1$ and $W_2$, wherein the width $W_1$ is set smaller than the width $W_2$. By changing the lateral width, it is possible to change the refractive index in the first and second optical waveguides 33 and 34. As the rest of the feature is substantially identical with the devices described previously, further description will be omitted.

Figure 20:
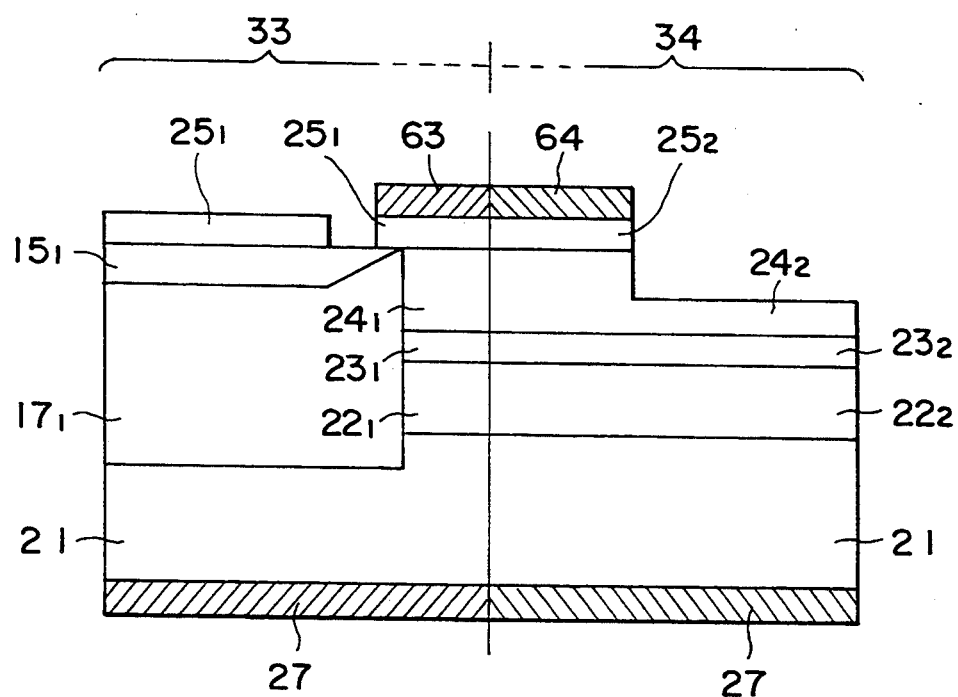
FIG. 20 is a diagram similar to FIG. 19 showing the cross section of the tunable laser diode according to a sixth embodiment of the present invention.

FIG. 20 shows a tunable laser diode 70 according to a sixth embodiment. In this embodiment, too, only the cross sectional diagram will be described.

Referring to FIG. 20, the optical waveguide 33 has the structure similar to the optical waveguide 33 of the device 20 whereas the optical waveguide 34 has a mesa structure in the clad layer $24_2$. In correspondence to this, the mesa structure $21_2$ is eliminated from the optical waveguide 34. In other words, the optical waveguide 34 uses a ridge structure corresponding to the mesa structure of the clad layer $24_2$. In such a structure, the refractive index of the optical waveguide 34 becomes generally higher than the refractive index of the optical waveguide 33. Thereby, the effective optical path length is changed in the optical waveguide 33 and in the optical waveguide 34. By controlling the refractive index of the respective waveguides by the injection of the carriers or by applying a reverse bias voltage, it is possible to control the interference of the optical beams in the optical waveguides 33 and 34, it is possible to change the oscillation wavelength for a wide range according to the principle shown in FIG. 9 or FIG. 14.

Further, the present invention is not limited to the embodiments described heretofore, but various variations and modifications may be made without departing from the scope of the invention.

What is claimed is:

1. A tunable laser diode, comprising:

first reflection means for reflecting an optical beam;

second reflection means for reflecting an optical beam;

optical cavity means, extending between said first reflection means and said second reflection means, for establishing an optical resonance by transmitting an optical beam therethrough, said optical cavity means comprising a first waveguide part having a first end connected to said first reflection means and a second, opposite end and exchanging an optical beam with said first reflection means, a second waveguide part having a first end connected to said second reflection means and a second, opposite end and exchanging an optical beam with said second reflection means, a third waveguide part connecting said second end of said first waveguide part and said second end of said second waveguide part with each other for passing a first optical beam between said first and second reflection means, and a fourth waveguide part connecting said first end of said first waveguide part and said second end of said second waveguide part separately from said third waveguide part for passing a second optical beam between said first and second reflection means, said third and fourth waveguide parts merging with each other at said second end of said first waveguide part, said third and fourth waveguide parts merging with each other at said second end of said second waveguide part, said first waveguide part, said second waveguide part and said third waveguide part forming a first optical path having a first optical path length between said first and second reflection means, said first waveguide part, said second waveguide part and said fourth waveguide part forming a second optical path having a second optical path length between said first and second reflection means, the second optical path length being different from the first optical path length;

optical amplification means, provided at least on one of said first and second waveguide parts of said optical cavity means, for amplifying an optical beam that passes therethrough;

refractive index modulation means, provided on said third and fourth waveguide parts of said optical cavity means, for changing a refractive index of said third waveguide part and a refractive index of said fourth waveguide part, relatively to each other; and said third and fourth waveguide parts having respective, mutually different cross sectional structures supporting respective, and different, third and fourth numbers of optical waves therein.

2. A tunable laser diode as claimed in claim 1 in which said third waveguide part and said fourth waveguide part have respective physical lengths that are different from each other.

3. A tunable laser diode as claimed in claim 1 in which said third waveguide part and said fourth waveguide part have respective physical lengths that are equal to each other.

4. A tunable laser diode as claimed in claim 1 in which said optical cavity means comprises:

a semiconductor substrate doped to a first conductivity type and having a generally rectangular form, said substrate being defined by upper and lower major surfaces, first and second mutually opposing side walls separated from each other in a lateral direction, and first and second mutually opposing end surfaces separated from each other in a longitudinal direction;

a lower clad layer of a semiconductor material doped to said first conductivity type, said lower clad layer being provided on said upper major surface of said substrate and extending generally in the longitudinal direction from said first end surface to said second end surface of said substrate, said lower clad layer having upper and lower major surfaces and first and second mutually opposing side walls separated from each other in the lateral direction, said lower clad layer having a lateral width, corresponding to a distance between said first and second side walls, that is smaller than a distance between said first and second side walls of said substrate, said lower clad layer thereby defining an exposed part of said upper major surface of said substrate;

an active layer of an undoped semiconductor material provided on said upper major surface of said lower clad layer and extending in the longitudinal direction, in correspondence to said lower clad layer, from said first end surface to said second end surface of said substrate, said active layer having upper and lower major surfaces and first and second mutually opposing side walls separated from each other in the lateral direction;

an upper clad layer of a semiconductor material doped to a second, opposite conductivity type and provided so as to extend from said first end surface to said second end surface of said substrate, said upper clad layer being provided on said upper major surface of said active layer; and optical confinement means provided on said substrate in correspondence to said exposed part of said upper major surface of said substrate, said optical confinement means establishing an intimate contact with said first and second side walls of said first clad layer and said first and second side walls of said active layer for laterally confining an optical beam in said active layer;

said active layer having a refractive index larger than any of said upper and lower clad layers and said optical confinement means;

said first and second end surfaces respectively acting as said first and second reflection means;

said active layer and said lower clad layer extending together from said first end surface toward said second end surface in correspondence to said first waveguide part, said active layer and said lower clad layer extending together from said second end surface toward said first end surface in correspondence to said second waveguide part, wherein said active layer and said lower clad layer form together a branched structure including a first branch and a second branch between said first and second waveguide parts in correspondence to said third waveguide part and said fourth waveguide part, respectively, each of said first and second branches comprising said lower clad layer and said active layer which is provided thereon.

5. A tunable laser diode as claimed in claim 4 in which said optical amplification means comprises first ohmic electrode means provided on said upper major surface of said upper clad layer in correspondence to said first and second waveguide parts, for injecting carriers therein, second ohmic electrode means provided on said lower major surface of said substrate in correspondence to said first and second waveguide parts for recovering the injected carriers therefrom, and carrier confinement means provided on said optical confinement means for confining a path of the injected carriers such that the carriers injected from the first ohmic electrode means flow preferentially to said active layer.

6. A tunable laser diode as claimed in claim 4 in which said third waveguide part comprises first ohmic electrode means provided on said upper major surface of said upper clad layer that forms said third waveguide part for injecting carriers by establishing an ohmic contact therewith and second ohmic electrode means provided on said lower major surface of said substrate for recovering the injected carriers by establishing an ohmic contact therewith, said fourth waveguide part comprises third ohmic electrode means provided on said upper major surface of said upper clad layer that forms said fourth waveguide part for injecting carriers by establishing an ohmic contact therewith, and second ohmic electrode means provided on said lower major surface of said substrate for collecting the injected carriers by establishing an ohmic contact therewith, wherein said first ohmic electrode means and said third ohmic electrode means are separated from each other.

7. A tunable laser diode as claimed in claim 4 in which said third waveguide part comprises first electrode means provided on said upper major surface of said upper clad layer that forms said third waveguide part for applying a first electric voltage thereto and second electrode means provided on said lower major surface of said substrate for applying a second electric voltage thereto, said fourth waveguide part comprises third electrode means provided on said upper major surface of said upper clad layer that forms said fourth waveguide part for applying a third electric voltage thereto and a fourth electrode means provided on said lower major surface of said substrate for applying a fourth electric voltage thereto, wherein said first electrode means and said third electrode means are separated from each other.

8. A tunable laser diode as claimed in claim 4 in which said optical confinement means comprises a semiconductor layer doped to said second conductivity type.

9. A tunable laser diode as claimed in claim 4 in which each of said active layers, said lower clad layers and said upper clad layers of said first and second waveguide parts has a thickness and a composition which are identical in said third waveguide part and in said fourth waveguide part.

10. A tunable laser diode as claimed in claim 4 in which said active layer has respective, different thicknesses in said third waveguide part and in said fourth waveguide part.

11. A tunable laser diode as claimed in claim 4 in which said lower clad layer has respective, different thicknesses in said third waveguide part and in said fourth waveguide part.

12. A tunable laser diode as claimed in claim 4 in which said active layer has respective, different lateral widths, between said opposing first and second side walls, in said third waveguide part and in said fourth waveguide part.

13. A tunable laser diode as claimed in claim 12 in which said lower clad layer has a lateral width corresponding to said lateral width of said active layer, wherein said lower clad layer has respective, different thicknesses in said third waveguide part and in said fourth waveguide part, in correspondence to said lateral width of said active layer.

14. A tunable laser diode as claimed in claim 4 in which said optical confinement means in said third waveguide part has a first structure characterized by a first refractive index, and said optical confinement means in said fourth waveguide part comprises a second structure characterized by a second, different refractive index.

15. A tunable laser diode, comprising:
first reflection means for reflecting an optical beam;
second reflection means for reflecting an optical beam;
optical cavity means, extending between said first reflection means and said second reflection means, for establishing an optical resonance by transmitting an optical beam therethrough, said optical cavity means comprising a first waveguide part having a first end connected to said first reflection means and a second, opposite end and exchanging an optical beam with said first reflection means, a second waveguide part having a first end connected to said second reflection means and a second, opposite end and exchanging an optical beam with said second reflection means, a third waveguide part connecting said second end of said first waveguide part and said second end of said second waveguide part with each other for passing a first optical beam between said first and second reflection means, and a fourth waveguide part connecting said first end of said first waveguide part and said second end of said second waveguide part separately from said third waveguide part for passing a second optical beam between said first and second reflection means, said third and fourth waveguide parts merging with each other at said second end of said first waveguide part, said third and fourth waveguide parts merging with each other at said second end of said second waveguide part, said first waveguide part, said second waveguide part and said third waveguide part forming a first optical path having a first optical path length between said first and second reflection means, said first waveguide part, said second waveguide part and said fourth waveguide part forming a second optical path having a second optical path length between said first and second reflection means, the second optical path length being different from said first optical path length;
optical amplification means provided at least on one of said first and second waveguide parts of said optical cavity means for amplifying an optical beam that passes therethrough; and
refractive index modulation means, provided on said third and fourth waveguide parts of said optical cavity means, for changing a refractive index of said third waveguide part and a refractive index of said fourth waveguide part relatively to each other, said refractive index modulation means changing said refractive indices of said third and fourth waveguide parts by inducing an electro-optical effect in at least one of said third and fourth waveguide parts by applying a reverse biasing thereto.

16. A tunable laser diode as claimed in claim 15 in which said third waveguide part and said fourth waveguide part have respective physical lengths that are different from each other.

17. A tunable laser diode as claimed in claim 15 in which said third waveguide part and said fourth waveguide part have respective physical lengths that are equal to each other.

18. A tunable laser diode as claimed in claim 15 in which said optical cavity means comprises:
a semiconductor substrate doped to a first conductivity type and having a generally rectangular shape, said substrate being defined by upper and lower major surfaces, first and second, mutually opposing side walls separated from each other in a lateral direction, and first and second, mutually opposing end surfaces separated from each other in longitudinal direction;
a lower clad layer of semiconductor material doped to said first conductivity type, said lower clad layer being provided on said upper major surface of said substrate and extending generally in the longitudinal direction from said first end surface to said second end surface of said substrate, said lower clad layer having upper and lower major surfaces and first and second mutually opposing side walls separated from each other in the lateral direction, said lower clad layer having a lateral width, corresponding to a distance between said first and second side walls, that is smaller than a distance between said first and second side walls of said substrate, said lower clad layer thereby defining an exposed part of said upper major surface of said substrate;
an active layer of an undoped semiconductor material provided on said upper major surface of said lower clad layer and extending in the longitudinal direction, in correspondence to said lower clad layer from said first end surface to said second end surface of said substrate, said active layer having upper and lower major surfaces and first and second mutually opposing side walls separated from each other in the lateral direction;
an upper clad layer of a semiconductor material doped to a second, opposite conductivity type and provided so as to extend from said first end surface to said second end surface of said substrate, said upper clad layer being provided on said upper major surface of said active layer; and
optical confinement means provided on said substrate in correspondence to said exposed part of said upper major surface of said substrate, said optical confinement means establishing an intimate contact with said first and second side walls of said first clad layer and said first and second side walls of said active layer for laterally confining an optical beam in said active layer;

said active layer having a refractive index larger than any of said upper and lower clad layers and said optical confinement means;

said first and second end surfaces respectively acting as said first and second reflection means; and said active layer and said lower clad layer extending together from said first end surface toward said second end surface in correspondence to said first waveguide part, said active layer and said lower clad layer extending together from said second end surface toward said first end surface in correspondence to said second waveguide part, wherein said active layer and said lower clad layer form together a branched structure including a first branch and a second branch between said first and second waveguide parts in correspondence to said third waveguide part and said fourth waveguide part, respectively, each of said first and second branches comprising said lower clad layer and said active layer which is provided thereon.

19. A tunable laser diode as claimed in claim 18 in which said optical amplification means comprises first ohmic electrode means provided on said upper major surface of said upper clad layer in correspondence to said first and second waveguide parts, for injecting carriers therein, second ohmic electrode means provided on said lower major surface of said substrate in correspondence to said first and second waveguide parts for recovering the injected carriers therefrom, and carrier confinement means provided on said optical confinement means for confining a path of the injected carriers such that the carriers injected from the first ohmic electrode means flow preferentially to said active layer.

20. A tunable laser diode as claimed in claim 18 in which said third waveguide part comprises first ohmic electrode means provided on said upper major surface of said upper clad layer that forms said third waveguide part for injecting carriers by establishing an ohmic contact therewith and second ohmic electrode means provided on said lower major surface of said substrate for recovering the injected carriers by establishing an ohmic contact therewith, said fourth waveguide part comprises third ohmic electrode means provided on said upper major surface of said upper clad layer that forms said fourth waveguide part for injecting carriers by establishing an ohmic contact therewith, and second ohmic electrode means provided on said lower major surface of said substrate for collecting the injected carriers by establishing on ohmic contact therewith, wherein said first ohmic electrode means and said third ohmic electrode means are separated from each other.

21. A tunable laser diode as claimed in claim 18 in which said third waveguide part comprises first electrode means provided on said upper major surface of said upper clad layer that forms said third waveguide part for applying a first electric voltage thereto and second electrode means provided on said lower major surface of said substrate for applying a second electric voltage thereto, said fourth waveguide part comprises third electrode means provided on said upper major surface of said upper clad layer that forms said fourth waveguide part for applying a third electric voltage thereto and a fourth electrode means provided on said lower major surface of said substrate for applying a fourth electric voltage thereto, wherein said first electrode means and said third electrode means are separated from each other.

22. A tunable laser diode as claimed in claim 18 in which said optical confinement means comprises a semiconductor layer doped to said second conductivity type.

23. A tunable laser diode as claimed in claim 18 in which each of said active layers, said lower clad layers and said upper clad layers of said first and second waveguide parts has a thickness and a composition which are identical in said third waveguide part and in said fourth waveguide part.

24. A tunable laser diode as claimed in claim 18 in which said active layer has respective, different thicknesses in said third waveguide part and in said fourth waveguide part.

25. A tunable laser diode as claimed in claim 18 in which said lower clad layer has respective, different thicknesses in said third waveguide part and in said fourth waveguide part.

26. A tunable laser diode as claimed in claim 18 in which said active layer has respective, different lateral widths, between said opposing first and second side walls, in said third waveguide part and in said fourth waveguide part.

27. A tunable laser diode as claimed in claim 26 in which said lower clad layer has a lateral width corresponding to said lateral width of said active layer, wherein said lower clad layer has respective, different thicknesses in said third waveguide part and in said fourth waveguide part, in correspondence to said lateral width of said active layer.

28. A tunable laser diode as claimed in claim 18 in which said optical confinement means in said third waveguide part has a first structure characterized by a first refractive index, and said optical confinement means in said fourth waveguide part comprises a second structure characterized by a second, different refractive index.

* * * * *

UNITED STATES PATENT AND TRADEMARK OFFICE
CERTIFICATE OF CORRECTION

PATENT NO.  : 5,388,106
DATED       : Feb. 7, 1995
INVENTOR(S) : TABUCHI

It is certified that error appears in the above-indentified patent and that said Letters Patent is hereby corrected as shown below:

Col. 5,   line 9, change "$(\lambda_{m1} = \lambda^{m2} = \lambda_0)$" to --$(\lambda_{m1} = \lambda_{m2} = \lambda_0)$--;
          line 42, change "he" to --be--.

Col. 9,   line 26, after "33 and" insert --34--.

Col. 10,  line 17, change "land" to --and--.

Col. 11,  line 10, after "formed" insert --,--.

Signed and Sealed this

Fifteenth Day of August, 1995

Attest:

BRUCE LEHMAN

*Attesting Officer*     *Commissioner of Patents and Trademarks*